(12) United States Patent
Cimino

(10) Patent No.: US 12,438,012 B2
(45) Date of Patent: Oct. 7, 2025

(54) AUTOMATIC CONTROL OF SUBSTRATES

(71) Applicant: Applied Materials, Inc., Santa Clara, CA (US)

(72) Inventor: Mauro Cimino, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 18/297,549

(22) Filed: Apr. 7, 2023

(65) Prior Publication Data

US 2024/0339341 A1 Oct. 10, 2024

(51) Int. Cl.
*H01T 23/00* (2006.01)
*H01L 21/67* (2006.01)
*H01L 21/683* (2006.01)
*H01L 21/687* (2006.01)

(52) U.S. Cl.
CPC .. *H01L 21/67103* (2013.01); *H01L 21/67248* (2013.01); *H01L 21/6833* (2013.01); *H01L 21/68785* (2013.01)

(58) Field of Classification Search
None
See application file for complete search history.

(56) References Cited

U.S. PATENT DOCUMENTS 11,533,783 B2 * 12/2022 Cimino ............ H01L 21/67103
2005/0267606 A1 12/2005 Bartlett, Jr. et al.
2006/0100735 A1 5/2006 Hauf et al.
2008/0086228 A1 4/2008 Yamaji et al.
2021/0022212 A1 1/2021 Cimino et al.

FOREIGN PATENT DOCUMENTS

WO    2007114987 A2    10/2007

OTHER PUBLICATIONS

Application No. PCT/US2024/010497, International Search Report and Written Opinion, Mailed on May 1, 2024, 12 pages.

* cited by examiner

*Primary Examiner* — Stephen W Jackson
(74) *Attorney, Agent, or Firm* — Kilpatrick Townsend & Stockton LLP

(57) ABSTRACT

The present technology includes methods and systems for improving substrate processing. Methods and systems include disposing a substrate on a pedestal that includes a plurality of heating zones each with an independent heater, processing the substrate according to an initial substrate processing recipe that includes an initial pedestal temperature, collecting initial substrate feedback of one or more substrate properties and providing the data as a first input to a substrate control algorithm. Methods include generating a substrate model based upon one or more modeling tests of the substrate, providing the generated substrate model as a second input to the substrate control algorithm, controlling the heater power or heater temperature to achieve a targeted substrate property in one or more substrate regions. Methods include where the correction is calculated and performed by a processor running the substrate control algorithm based upon the first input and the second input.

20 Claims, 9 Drawing Sheets

AUTOMATIC CONTROL OF SUBSTRATES

TECHNICAL FIELD

The present technology relates to semiconductor manufacturing processes and devices. More specifically, the present technology relates to substrate control for production of high-quality semiconductor devices.

BACKGROUND

Integrated circuits are made possible by processes which produce intricately patterned material layers on substrate surfaces. Producing patterned material on a substrate requires controlled methods for deposition, expansion, and removal of materials. However, with new device designs, producing high quality layers of material may be challenging. For instance, as the feature size of device patterns get smaller for integrated circuits, the critical dimension (CD) specifications of these features become a more important criterion for stable and repeatable device performance. Allowable variation across a substrate processed within a processing chamber is difficult to achieve due to chamber asymmetries such as showerhead and substrate temperature, flow conductance, and RF fields, for example.

Thus, there is a need for improved systems and methods that can be used to produce high quality devices and structures. These and other needs are addressed by the present technology.

BRIEF SUMMARY

Embodiments of the present technology are generally directed to methods for controlling substrate processing. Methods include disposing a substrate on a pedestal, where the pedestal includes a plurality of heating zones, each zone including an independent heater. Methods include processing the substrate according to an initial substrate processing recipe, where the initial substrate processing recipe includes one or more substrate processing steps, and an initial pedestal temperature. In embodiments, methods include collecting initial substrate feedback of one or more substrate properties. Methods include providing the data representing the initial substrate feedback as a first input to a substrate control algorithm. Methods include generating a substrate model based upon one or more modeling tests of the substrate. Methods include providing the generated substrate model as a second input to the substrate control algorithm. Methods include correcting the power or temperature and/or a heat-exchanger/chiller temperature of one or more heating zones to achieve a targeted substrate property. In embodiments, the correction is calculated and performed by a processor running the substrate control algorithm based upon the first input and the second input. Methods include updating the initial substrate processing recipe based upon the correction, forming an updated processing recipe.

In embodiments, methods include where the one or more substrate properties includes substrate temperature, thickness of one or more layers across a substrate, substrate etch depth, or a combination thereof measured at two or more spaced apart regions on the substrate. In embodiments, the one or more properties is substrate temperature, and the substrate includes a plurality of temperature sensors, where the temperature is provided at each temperature sensor. In embodiments, the heater power or heater temperature and/or heat-exchanger/chiller temperature is corrected to control the targeted substrate property in one or more of the substrate regions corresponding to a portion of, or each of, the plurality of temperature sensors. In more embodiments, the one or more substrate properties is thickness of one or more layers across a substrate, substrate etch depth, or a combination thereof, and the heater power or heater temperature and/or heat-exchanger/chiller temperature is corrected to control the targeted substrate property at a portion of, or at each of, the two or more spaced apart regions. In further embodiments, the heater power or heater temperature and/or heat-exchanger/chiller temperature is corrected to achieve the targeted substrate property at a portion of, or at each of, the two or more spaced apart zones. In more embodiments, the plurality of heating zones includes greater than or about five heating zones.

Additionally or alternatively, in embodiments, one or more modeling tests include correcting the heater power or heater temperature and/or heat-exchanger/chiller temperature. In embodiments, the one or more modeling tests are automatically selected based upon the initial substrate feedback, or are generated by a substrate modeling algorithm, where the correction is calculated and performed by a processor running the substrate modeling algorithm. In more embodiments, the method further includes processing the substrate according to the updated processing recipe and collecting updated substrate feedback of the one or more substrate properties. In further embodiments, the substrate comprises two or more regions, wherein at least one of the two or more regions comprises the targeted substrate property, wherein the corrected heater power or heater temperature and/or heat-exchanger/chiller temperature is in one or more heating zones disposed horizontally adjacent to the region comprising the targeted substrate property.

In embodiments, methods further include comparing the updated substrate feedback to the targeted substrate property, and, if a difference between the updated substrate feedback and the targeted substrate property is greater than a predetermined level, further correcting the heater power or heater temperature and/or heat-exchanger/chiller temperature of the one or more of the heating zones to achieve the targeted substrate property, where the further correction is calculated and performed, by the processor running the substrate control algorithm, based on data representing the updated substrate feedback and the second input, and updating the updated processing recipe based upon the further correction, forming a second updated processing recipe. In more embodiments, the predetermined level is calculated from one or more modeling tests selected to estimate a noise value, where the predetermined level is greater than or about a level corresponding to a noise value. In embodiments, methods include updating the substrate model based upon the further correction. In embodiments, methods include processing one or more further substrates based upon the second updated processing recipe. In further embodiments, methods include comparing the second updated substrate feedback to the targeted substrate property, and, if a difference between the second updated substrate feedback and the targeted substrate property is greater than or about 5%, correcting the heater power or heater temperature and/or heat-exchanger/chiller temperature of the one or more of the heating zones to achieve the targeted substrate property, where the correction is calculated and performed, by the processor running the substrate control algorithm, based on data representing the second updated substrate feedback and the second input, and updating the second updated processing recipe based upon the correction, forming a third updated processing recipe.

Embodiments of the present technology are also generally directed to semiconductor processing systems. Systems include a pedestal that includes a plurality of heating zones configured to support a substrate, and a controller configured to execute a substrate control algorithm that is part of a substrate control architecture. Systems include where the controller is configured to process the substrate according to an initial substrate processing recipe that includes one or more substrate processing steps and an initial pedestal temperature. Systems include where the controller is configured to collect initial substrate feedback of one or more substrate properties. Systems include where the controller is configured to provide data representing the initial substrate feedback as a first input to the substrate control algorithm. Systems include where the controller is configured to generate a substrate model based upon one or more modeling tests of the substrate. Systems include where the controller is configured to provide the generated substrate model as a second input to the substrate control algorithm. Systems include where the controller is configured to correct heater power or heater temperature and/or heat-exchanger/chiller temperature of one or more of the heating zones to achieve a targeted substrate property, where the correction is calculated and performed by a processor running the substrate control algorithm, based on the first input and second input. Systems include where the controller is configured to update the initial substrate processing recipe based upon the correction, forming an updated processing recipe.

In embodiments, systems include where each heating zone includes a temperature sensor. In more embodiments, the substrate control algorithm is a closed-loop algorithm. In further embodiments, the one or more modeling tests are selected from a plurality of modeling tests stored in the substrate control architecture.

Embodiments of the present technology are also generally directed to semiconductor processing systems. Systems include a chamber body, a first pedestal configured to support a substrate that includes a plurality of heating zones disposed in the chamber body, a second pedestal configured to support a second substrate that includes a plurality of heating zones disposed in the chamber body, and a controller configured to execute a substrate control algorithm that is part of a substrate control architecture. Systems include where the controller is configured to process the first substrate and the second substrate according to an initial substrate processing recipe that includes one or more substrate processing steps and an initial pedestal temperature. Systems include where the controller is configured to collect initial substrate feedback of one or more substrate properties for the first substrate and the second substrate. Systems include where the controller is configured to provide data representing the initial substrate feedback of the first substrate and the second substrate to the substrate control algorithm. Systems include where the controller is configured to generate a first substrate model and a second substrate model based upon one or more modeling tests of the first substrate and the second substrate. Systems include where the controller is configured to provide the first substrate model and the second substrate model to the substrate control algorithm. Systems include where the controller is configured to correct the heater power or heater temperature and/or heat-exchanger/chiller temperature of one or more of the heating zones of the first plurality of heating zones and the second plurality of heating zones to achieve a targeted substrate property for the first substrate and the second substrate. In systems, the correction is calculated and performed, by a processor running the substrate control algorithm, based on the initial substrate feedback of the first substrate and the first substrate model for the first substrate and the initial substrate feedback of the second substrate and the second substrate model for the second substrate.

In embodiments, systems include where the power or temperature correction for the first plurality of heating zones is different than the correction for the second plurality of heating zones.

Such technology may provide numerous benefits over conventional systems and techniques. For example, the processes and systems may significantly reduce processing defects in substrates. Additionally, the processes and systems may significantly decrease differences or variations across substrates, even substrates produced on different pedestals, different chamber sides, or even different chambers. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
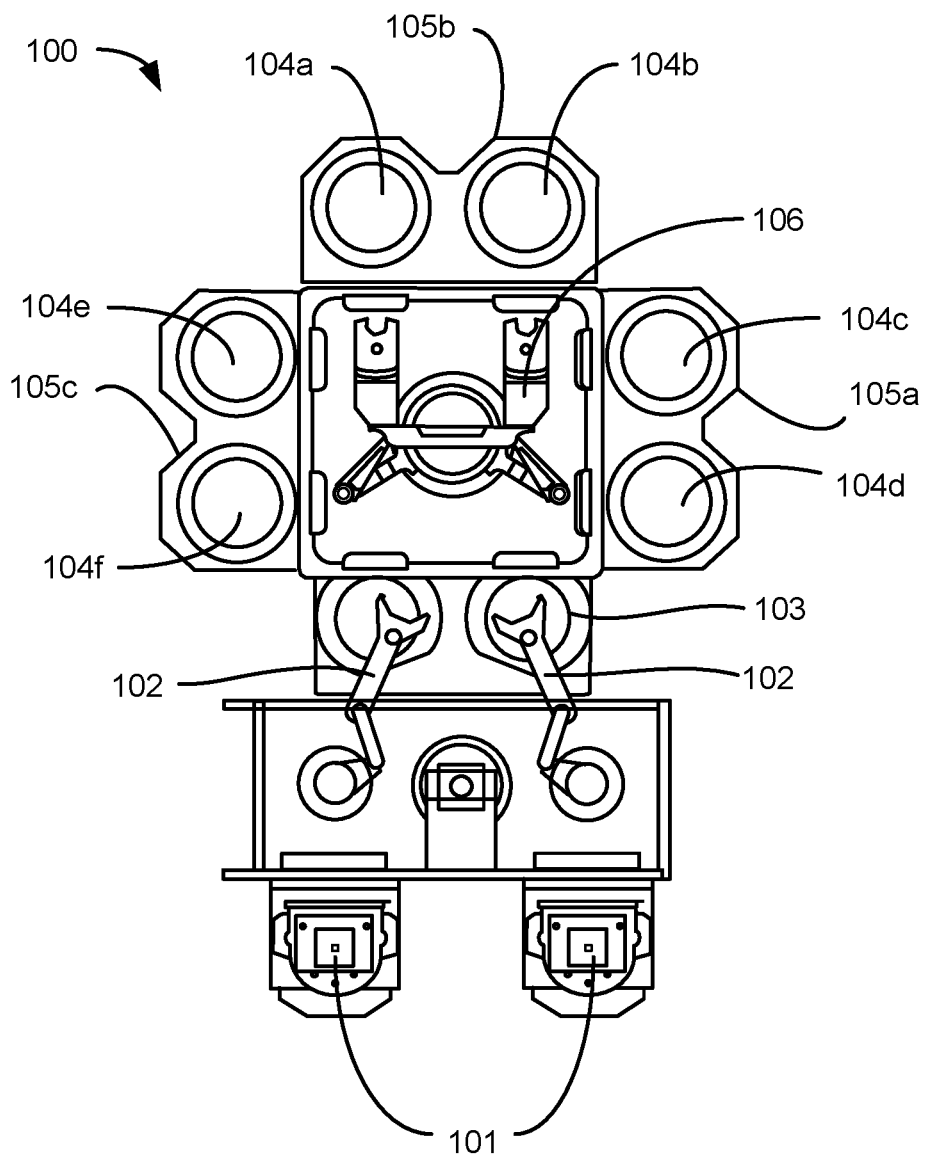
FIG. 1A shows a top-down schematic view of a processing chamber according to embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing involves a number of different chemical and physical processes enabling minute integrated circuits to be created on a substrate. Layers of materials which make up the integrated circuit can be created by chemical vapor deposition, physical vapor deposition, epitaxial growth, and the like. Some of the layers of material are patterned using photoresist masks and wet or dry etching techniques. In the manufacture of integrated circuits, plasma processes are often used for deposition or etching of various material layers. Plasma processing offers many advantages over thermal processing. However, plasma processes, as well as other deposition and etching processes can be highly dependent upon the temperature of the substrate.

Uniformity of temperature control across the surface of a substrate can be challenging due to chamber-to-chamber differences, side-to-side differences within the same chamber or separate chambers, and even pedestal-to-pedestal differences within the same chamber or separate chambers. For instance, many chambers can vary minimally to quite significantly in thermal fingerprint due to design tolerances, placement in a facility (e.g., near a heat source or spaced apart), or the like, even amongst similar chambers. Common heat sources and sinks in processing chambers can include pedestal heaters, pedestal cooling plates, the lid assembly and/or showerhead (e.g., how far the lid assembly is placed from the substrate), slit valves, and the temperature of the chamber body itself, all of which can impact the temperature of a substrate. As may be apparent, uniformly heating the substrate is complicated, and non-uniform heating can result in undesired local hot and cold "spots" across the substrate. Such a phenomenon can result in variations in substrate processing results due at least in part to the non-uniform temperature.

Attempts have been made to improve temperature uniformity by continuing to increase the number of heating zones present on a pedestal (also referred to as a substrate support) with the aim of removing regional hot and cold "spots". Some, conventional substrate supports may have edge to center temperature control or other multi-zone control. However, the control of each zone's temperature is dependent upon engineering modeling performed on a single chamber and at ideal conditions within the chamber. Thus, if non-ideal conditions are encountered, or if the test or production chamber differs from the modeled chamber, further corrections must be made manually after the defect is observed and must occur on a chamber-by-chamber (or side-to-side or pedestal-to-pedestal) basis. In addition, most engineering models struggle to properly address the highly non-linear behavior of the thermo-chemical processes to which substrates are subjected. This can be problematic, as many systems can be running tens, hundreds, or even thousands of chambers and substrates simultaneously, rendering post-processing manual correction unfeasible for consistent processing. In addition, as the number of heating zones continue to increase on substrate supports, manual correction becomes increasingly unwieldy or even unfeasible. Namely, conventional processes require manual trial-by-error corrections of the temperature in each heating zone or zones, to correct the regional heating defect(s) on the substrate. Thus, as the number of heating zones continue to increase and as chambers continue to become more complex, the number of attempts necessary for successful defect correction also increases exponentially, rendering such manual processes unsuitable, if not infeasible, for manual correction.

In addition or alternatively to the challenges inherent with uniformly heating a substrate, even a uniformly heated substrate may not necessarily correspond to a substrate with low variations, such as uniform thickness of one or more layers across a substrate, or other substrate properties. In fact, the thickness of one or more layers across a processed substrate, for instance, does not just depend on its thermal properties, but also on a plurality of other factors and sources altering the chemical reactions within a semiconductor processing chamber. Such chemical reactions are often highly non-linear, and the number of such factors and sources is large enough to make any offline modeling attempt virtually impossible and extremely time consuming. In fact, any attempt to systematically model the physical reactions resulting in a variation of the thickness of one or more layers across a substrate at different locations within the substrate surface, and for different parameters and chamber processing conditions, would require extremely large amounts of preliminary data, engineering time to collect and process such data, system downtime, and engineering time to generate and validate any possible model resulting from such data. Namely, such an attempt would require data points for each variable to be manually determined and controlled. Such an extremely large number of resources required to perform a conventional modeling of the thickness of one or more layers across a substrate may even fail to characterize the correct thickness of one or more layers across a substrate in the presence of unexpected or unmodeled chamber-to-chamber or pedestal-to-pedestal differences. Thus, conventional methodologies, are limited in corrections available when variations are observed, namely, the inability to efficiently and quickly model substrate properties across the entire surface of the substrate for a large number of chamber processing conditions and processing parameters.

Moreover, a uniform profile of a certain substrate property like surface temperature, thickness of one or more layers, etch rate, and others, across the substrate surface, may not always represent the desired target. In fact, in some embodiments it may be desirable to select a non-uniform target profile, namely, a different target for different locations on the substrate surface. A non-uniform target profile can be provided in terms of a finite number of points, each point characterized by a specific magnitude and coordinate location on the substrate. The number and locations of all points must be custom-definable to provide the user with the necessary freedom to select a custom target profile for different process requirements. It is expected that the number and location of target points of a non-uniform target profile for a substrate are not a one-to-one match with the number and location of heating zones of a substrate support. Namely, the location of the target points could vary from process condition to process condition, and the number of target points could be lower or higher than the number of heating zones of a pedestal heater. However, conventional techniques fail to provide a substrate control solution for custom defined target profiles with variable distribution of points across the substrate, and where the heating zones of the pedestal are not aligned with the location of the target points on the substrate.

Another drawback of conventional techniques is the inability to adapt in-situ for the control of different properties of the substrate. A conventional technique developed for the control of the thickness of one or more layers across a substrate, for instance, cannot be used for the control of the substrate temperature, and vice-versa. However, at different stages of the production process it is necessary to regulate different substrate properties. For instance, during the calibration stage it may be desirable to regulate the temperature across the substrate surface to a certain target profile, whereas during a pre-production stage it is desirable to regulate the thickness of one or more layers across the substrate surface to a certain target profile. However, conventional techniques fail to provide a unifying framework for modeling and control of different substrate properties.

The present technology overcomes these and other challenges by providing a closed-loop system for automated control of substrate properties based upon feedback from the substrate during, or after undergoing, processing conditions. Processes and methods according to the present technology can surprisingly account for unexpected or previously unmodeled behaviors, even on a chamber-to-chamber, side-to-side, or pedestal-to-pedestal basis. Moreover, by utilizing processes and methods according to the present technology, the substrate control system can be optimized anytime a substrate recipe is altered. For instance methods and processes of the present technology require a drastically reduced number of iterations to regulate a targeted substrate property to a desired substrate target profile, such as even five or less iterations in embodiments. Namely, in embodiments, the present technology provides methods and processes for correcting pedestal temperature in order to control substrate properties, based upon substrate feedback, including in pedestals having a plurality of individual heating zones. Surprisingly, by utilizing substrate feedback, as opposed to pedestal feedback alone, the present technology has found that pedestal conditions may be controlled to minimize or eliminate undesirable chamber-to-chamber and pedestal-to-pedestal inconsistencies. Namely, unlike prior beliefs, the present technology has found that uniform temperature across a pedestal alone is inadequate in view of chamber-to-chamber and pedestal-to-pedestal inconsistencies, and instead, that regulating a targeted substrate property to a substrate target profile across the surface of the substrate requires variations in temperature across the pedestal. Thus, the present technology provides methods and processes for overcoming chamber differences to provide improved control of substrate temperature profiles, even in highly complex chambers, or across a large number of chambers, and/or pedestals.

Although the remaining disclosure will routinely identify specific pedestal control methods and processes utilizing the disclosed technology, it will be readily understood that the systems and methods are equally applicable to a variety of other semiconductor processing operations and systems. Accordingly, the technology should not be considered to be so limited as for use with the described systems or processes alone. The disclosure will discuss one possible system that can be used with the present technology before describing systems and methods or operations of exemplary process sequences according to some embodiments of the present technology. It is to be understood that the technology is not limited to the equipment described, and processes discussed may be performed in any number of processing chambers and systems, along with any number of modifications, some of which will be noted below.

FIG. 1A shows a top plan view of one embodiment of a processing system 100 of deposition, etching, baking, and curing chambers according to embodiments. In the figure, a pair of front opening unified pods (FOUPs) 101 supply substrates of a variety of sizes that are received by robotic arms 102 and placed into a low pressure holding area 103 before being placed into one of the substrate processing chambers 104a-f, positioned in tandem sections 105a-c. A second robotic arm 106 may be used to transport the substrate wafers from the holding area 103 to the substrate processing chambers 104a-f and back. Each substrate processing chamber 104a-f can be outfitted to perform a number of substrate processing operations including cyclical layer deposition (CLD), atomic layer deposition (ALD), chemical vapor deposition (CVD), physical vapor deposition (PVD), plasma-enhanced chemical vapor deposition (PECVD), etch, pre-clean, degas, orientation, and other substrate processes. The substrate processing chambers 104a-f may include one or more system components for depositing, annealing, curing and/or etching. Any one or more of the processes described herein may be carried out in chamber(s) separated from the fabrication system shown in different embodiments. It will be appreciated that additional configurations of chambers 104a-f are contemplated by system 100.

Figure 1B:
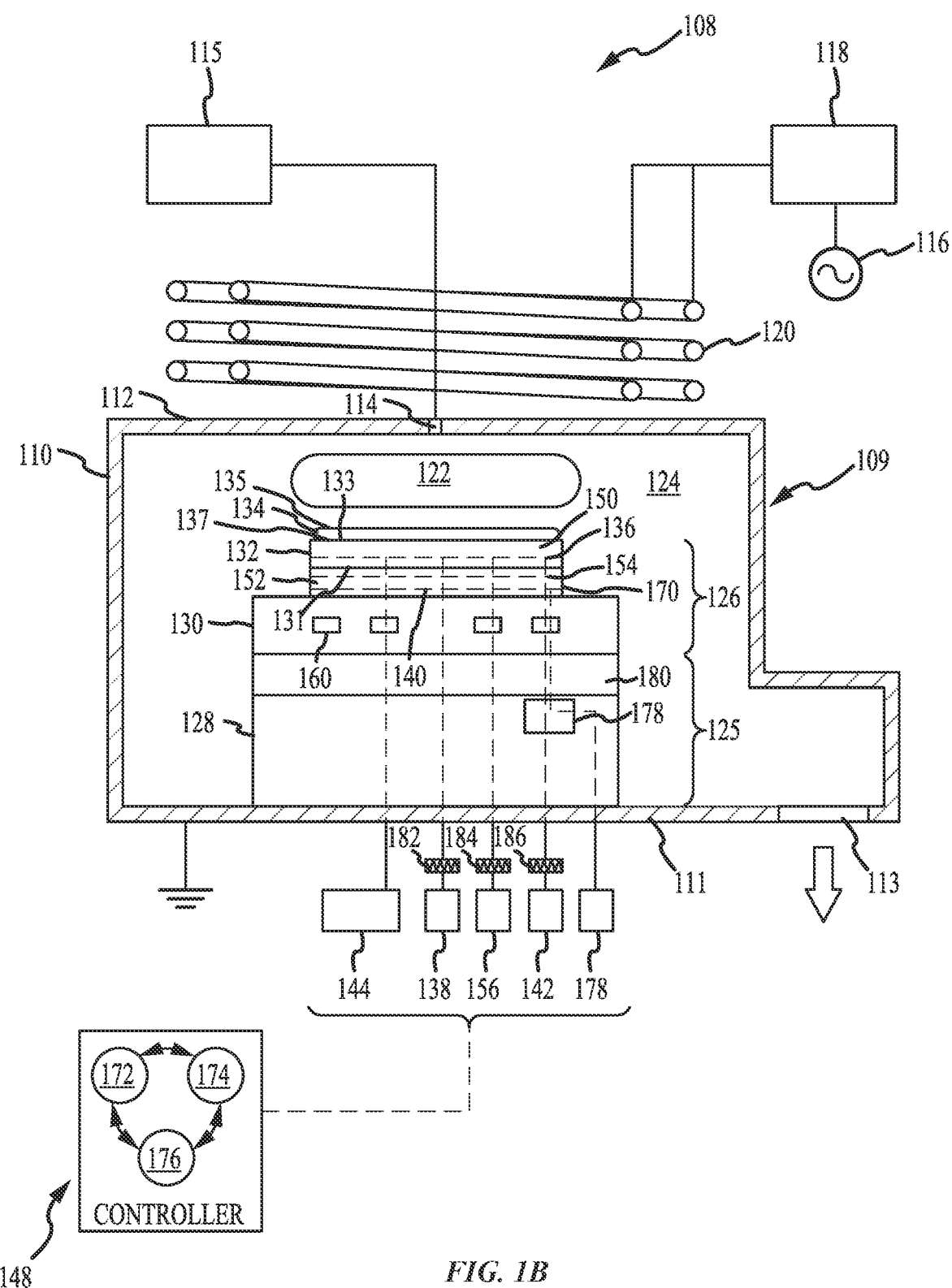
FIG. 1B shows a cross-sectional schematic side view of a processing chamber according to embodiments of the present technology.

FIG. 1B is a schematic view of an exemplary processing chamber 108, which may be suitable as any one or more of processing chambers 104a-f in embodiments or may be utilized in a separate processing system 100. Nonetheless, processing chamber 108 has a substrate support assembly 126 that may be utilized in methods and processes according to the present technology. As discussed above, the processing chamber 108 and/or substrate support assembly 126 may be utilized in other processing chambers, such as plasma treatment chambers, annealing chambers, physical vapor deposition chambers, chemical vapor deposition chambers, ion implantation chambers, and the like, or incorporated into a processing system including one or more such processing chambers. Additionally, the substrate support assembly 126 and/or processing chamber 108 may be used for other processing systems where the ability to provide an individualized and consistent temperature profile of a surface or workpiece, such as a substrate, is beneficial. Namely, methods and processes for providing independent and local control of the temperature across a substrate allow for improved substrate consistency within chambers and chamber-to-chamber. For example, consistency can be improved according to the present technology by accounting for local temperature disparities, such as hot and cold spots of the substrate itself and making corresponding changes to the processing chamber to address such disparities.

Nonetheless, the processing chamber 108 includes a grounded chamber body 109 in embodiments. The chamber body 109 includes sidewalls 110, a bottom 111 and a lid 112 which enclose an internal volume 124. The substrate support assembly 126 is disposed in the internal volume 124 and can support a substrate 134. The sidewalls 110 of the processing chamber 108 may include an opening (not shown) through which the substrate 134 may be robotically transferred into and out of the internal volume 124, such as by robotic arm 106 in embodiments. A pumping port 113 is formed in one of the sidewalls 110 or the bottom 111 of the chamber body 109 and is fluidly connected to a pumping system (not shown). The pumping system may maintain a vacuum environment within the internal volume 124 of the processing chamber 108 and may remove processing byproducts from the processing chamber.

A gas panel 115 may provide process gases and/or other gases to the internal volume 124 of the processing chamber 108 through one or more inlet ports 114 formed in the lid 112 and/or sidewalls 110 of the chamber body 109. In embodiments, the lid 112 is a lid assembly or lid stack that can include a showerhead (not separately shown). The process gases provided by the gas panel 115 may be energized within the internal volume 124 to form a plasma 122 utilized to process the substrate 134 disposed on the substrate support assembly 126. The process gases may be energized by RF power inductively coupled to the process gases from a plasma applicator 120 positioned outside the chamber body 109. In the embodiment depicted in FIG. 1B, the plasma applicator 120 is a pair of coaxial coils coupled through a matching circuit 118 to an RF power source 116. However, while RF plasma is illustrated as an exemplary plasma source, in embodiments, any plasma source or formation method may be utilized with processes and methods discussed herein.

A controller 148 is coupled to the processing chamber 108 to control operation of the processing chamber 108 and processing of the substrate 134. The controller 148 may be a general-purpose data processing system that can be used in an industrial setting for controlling various subprocessors and subcontrollers. Generally, the controller 148 includes a central processing unit (CPU) 172 in communication with memory 174 and input/output (I/O) circuitry 176, among other common components. Software commands executed by the CPU of the controller 148 may cause the processing chamber to, for example, introduce an etchant gas mixture (i.e., processing gas) into the internal volume 124, form the plasma 122 from the processing gas by application of RF power from the plasma applicator 120, and etch a layer of material on the substrate 134.

The substrate support assembly 126 generally includes at least a substrate support 132. The substrate support 132 may be a vacuum chuck, an electrostatic chuck (ESC) or other workpiece support surface. Though in some examples, an ESC is explicitly mentioned as the type of substrate support 132, the scope of this disclosure is not limited to ESCs. The substrate support assembly 126 may additionally include a pedestal heater assembly 170 that includes main resistive heating elements 154 (also referred to as main resistive heaters) and a plurality of additional resistive heating elements referred to herein as spatially tunable heating elements 140 (also referred to as independently controllable heaters).

The substrate support assembly 126 may also include a temperature-controlled base 130 that is heated and/or cooled by a chiller and/or heat-exchanger (HX/chiller) 144 coupled to the temperature-controlled base. The temperature-controlled base 130 may alternately be separate from the substrate support assembly 126. The substrate support assembly 126 may be removably coupled to a support pedestal 125. The support pedestal 125, which may include a pedestal base 128 and a facility plate 180, is mounted to the chamber body 109. The substrate support assembly 126 may be periodically removed from the support pedestal 125 to allow for refurbishment of one or more components of the substrate support assembly 126.

The facility plate 180 is configured to accommodate one or more driving mechanisms configured to raise and lower multiple lifting pins. Additionally, the facility plate 180 is configured to accommodate fluid connections from the substrate support 132 and the temperature-controlled base 130. The facility plate 180 is also configured to accommodate electrical connections from the substrate support 132 and the pedestal heater assembly 170. The one or more connections may run externally or internally of the substrate support assembly 126, and the facility plate 180 may provide an interface for the connections to a respective terminus.

The substrate support 132 has a mounting surface 131 and a workpiece surface 133 opposite the mounting surface 131.

A substrate support 132 shown in the example of FIG. 1B generally includes a chucking electrode 136 embedded in a dielectric body 150. The chucking electrode 136 may be configured as a mono polar or bipolar electrode, or other suitable arrangement. The chucking electrode 136 may be coupled through a radio frequency (RF) filter 182 to a chucking power source 138 which provides an RF or direct current (DC) power to electrostatically secure the substrate 134 to the upper surface of the dielectric body 150. For non-ESC-based substrate support 132, other types of mechanisms (such as mechanical clamping, vacuum-based clamping etc.) may be used to secure the substrate 134 to the substrate support 132. The RF filter 182 prevents RF power utilized to form a plasma 122 within the processing chamber 108 from damaging electrical equipment or presenting an electrical hazard outside the chamber. Once again, this disclosure is not limited by an ESC-based substrate support and/or to substrate support for RF applications.

A workpiece surface 133 of the substrate support 132 may include gas passages (not shown) for providing backside heat transfer gas to an interstitial space defined between the substrate 134 and the workpiece surface 133 of the substrate support 132. The substrate support 132 may also include lift pin holes for accommodating lift pins (both not shown) for elevating the substrate 134 above the workpiece surface 133 of the substrate support 132 to facilitate robotic transfer into and out of the processing chamber 108.

The temperature-controlled base 130 can be coupled to a chiller and/or heat-exchanger 144. The chiller and/or heat-exchanger 144 provides a temperature transfer fluid, such as a liquid, gas or combination thereof, which is circulated through one or more conduits 160 disposed in the temperature-controlled base 130. The fluid flowing through neighboring conduits 160 may be isolated to enable local control of the heat transfer between the substrate support 132 and different regions of the temperature-controlled base 130, which assists in controlling the lateral temperature profile of the substrate 134, which will be discussed in greater detail below.

The pedestal heater assembly 170 may include one or more main resistive heaters 154 and/or a plurality of spatially tunable heaters 140 embedded in a body 152. In some embodiments, the main resistive heaters and the spatially tunable heaters may be the same elements. The body 152 may additionally include a plurality of temperature sensors (not shown in FIG. 1B, shown in greater detail in FIGS. 2-4). Each of the plurality of temperature sensors may be used to measure a temperature at a region of the pedestal heater assembly and/or of a region of a substrate support associated with a region of the pedestal heater assembly, which will be discussed in greater detail below. In one embodiment, the pedestal heater assembly 170 is included in the substrate support 132.

The main resistive heaters 154 may be provided to elevate the temperature of the substrate support assembly 126 to a temperature for conducting chamber processes. The spatially tunable heaters 140 are complimentary to the main resistive heaters 154 and are configured to adjust the localized temperature of the substrate support 132 in a plurality of discrete locations within one or more of a plurality of laterally separated heating zones defined by the main resistive heaters 154. The spatially tunable heaters 140 provide localized adjustments to the temperature profile of the substrate 134 placed on the substrate support assembly 126. The main resistive heaters 154 operate on a globalized macro scale while the spatially tunable heaters 140 operate on a localized micro scale. However, it should be understood that, in embodiments, only one heater type and/or zone may be used with the present technology.

The main resistive heaters 154 may be coupled through an RF filter 184 to a main pedestal heater power source 156. The main pedestal heater power source 156 may provide 900 watts or more power to the main resistive heaters 154. The controller 148 may control the operation of the main pedestal heater power source 156, which is generally set to heat the substrate 134 to about a predefined temperature. In one embodiment, the main resistive heaters 154 include laterally separated heating zones, wherein the controller 148 enables one zone of the main resistive heaters 154 to be preferentially heated relative to the main resistive heaters 154 located in one or more of the other zones. For example, the main resistive heaters 154 may be arranged concentrically in a plurality of separated heating zones.

In one embodiment, the main resistive heaters 154 and/or the spatially tunable heaters 140 may be formed in the substrate support 132. In such an embodiment, the substrate support assembly 126 may be formed without the pedestal heater assembly 170, with the substrate support 132 disposed directly on the temperature-controlled base 130. A pedestal heater controller 178 (which may be part of the controller 148) may be disposed adjacent to the temperature-controlled base 130 and selectively control individual spatially tunable heaters 140.

The substrate support 132 and/or pedestal heater assembly 170 may include a plurality of temperature sensors for providing temperature feedback information. The temperature feedback information may be sent to the controller 148 for controlling the power applied by the main pedestal heater power source 156 to the main resistive heaters 154, for controlling the operations of the temperature-controlled base 130, and/or for controlling the power applied by the pedestal heater power source 142 to the spatially tunable heaters 140. Alternatively, or additionally, the temperature feedback information may be provided to the pedestal heater controller 178 for determining the operability of the spatially tunable heaters 140 and/or for controlling the power applied to the spatially tunable heaters 140. Each temperature sensor may be located proximate to one of the spatially tunable heaters and may be used to determine an operability of the nearby spatially tunable heater or heaters. In one embodiment, each temperature sensor is a resistance temperature detector (RTD).

As discussed above, the temperature of the substrate 134 in the processing chamber 108 may be influenced by the evacuation of the process gasses by the pump, by the slit valve door, and/or by other factors. The temperature-controlled base 130, the one or more main resistive heaters 154, and the spatially tunable heaters 140 all help to control the temperature of the substrate 134 according to processes and methods discussed in greater detail below.

As the number of independently controllable heating zones increase, the ability to generate a tailored thermal profile across a substrate also improves. However, previous attempts to control substrate surface temperature have utilized temperature variation feedback of the substrate support 126, and without considering other chamber factors discussed above, which does not always accurately reflect the temperature of the substrate 134 in real-time processing conditions. Thus, in embodiments, and as will be discussed in greater detail below, the present technology may control temperature or power profiles of the pedestal heater based upon process feedback from the substrate itself as well as substrate modeling based upon chamber interactions, in addition to pedestal interactions, so as to reduce variations in the temperature profile of the substrate. The temperature profile of the substrate may be made uniform or to vary according to a predetermined substrate target profile across regions of the substrate 134, based upon the tuning information collected according to the processes and methods of the present technology.

It is contemplated that the spatially tunable heaters 140, the main resistive heaters 154, and/or the temperature sensors may be arranged in different configurations and orientations. For example, the substrate support assembly 126 may have the plurality of spatially tunable heaters 140 for heating the substrate 134, may lack the main resistive heaters 154, and/or may include the temperature sensors to monitor the spatially tunable heaters 140. Alternatively, the substrate support assembly 126 may have the main resistive heaters 154 and/or the temperature sensors but may lack the spatially tunable heaters 140. In such embodiments, the temperature sensors could be disposed in a plane that is proximate to a plane that includes the main resistive heaters 154. However, in embodiments, the spatially tunable heaters 140 and the main resistive heaters 154 are disposed directly under each other within substrate support assembly 126. The spatially tunable heaters 140 may provide fine-tuned control for the temperature profile of the substrate 134 supported by the substrate support assembly 126, and the temperature sensors may provide detailed information on the operation of the spatially tunable heaters 140. Similar to the spatially tunable heaters 140, the temperature sensors may be formed or disposed on or in the body 152 of the pedestal heater assembly 170. Alternatively, the temperature sensors may be formed or disposed on or in electrostatic chuck forming all or a part of substrate support 132.

In one embodiment, the spatially tunable heaters 140 and temperature sensors are disposed within the pedestal heater assembly 170 while forming the pedestal heater assembly 170. In another embodiment, the spatially tunable heaters 140 and/or temperature sensors are directly disposed on the mounting surface 131 of the substrate support 132. In some embodiments, the main resistive heaters 154 are fabricated similar to the spatially tunable heaters 140. In embodiments where the main resistive heaters 154 are fabricated similar to the spatially tunable heaters 140, the main resistive heaters may optionally be utilized without benefit of additional spatially tunable heaters 140. In other words, the main resistive heaters 154 of the substrate support assembly 126 may themselves be spatially tunable, that is, segmented in to a plurality of discreet resistive heating elements. A separate temperature sensor may be disposed proximate to each of the main resistive heaters 154 in such an embodiment. Segmenting the main resistive heaters 154 in the form of small resistive heaters allows local control of hot and cold spots on the surface of the substrate 134. An additional layer of spatially tunable heaters 140 is optional, depending on the level of temperature control to be implemented.

Figure 2:
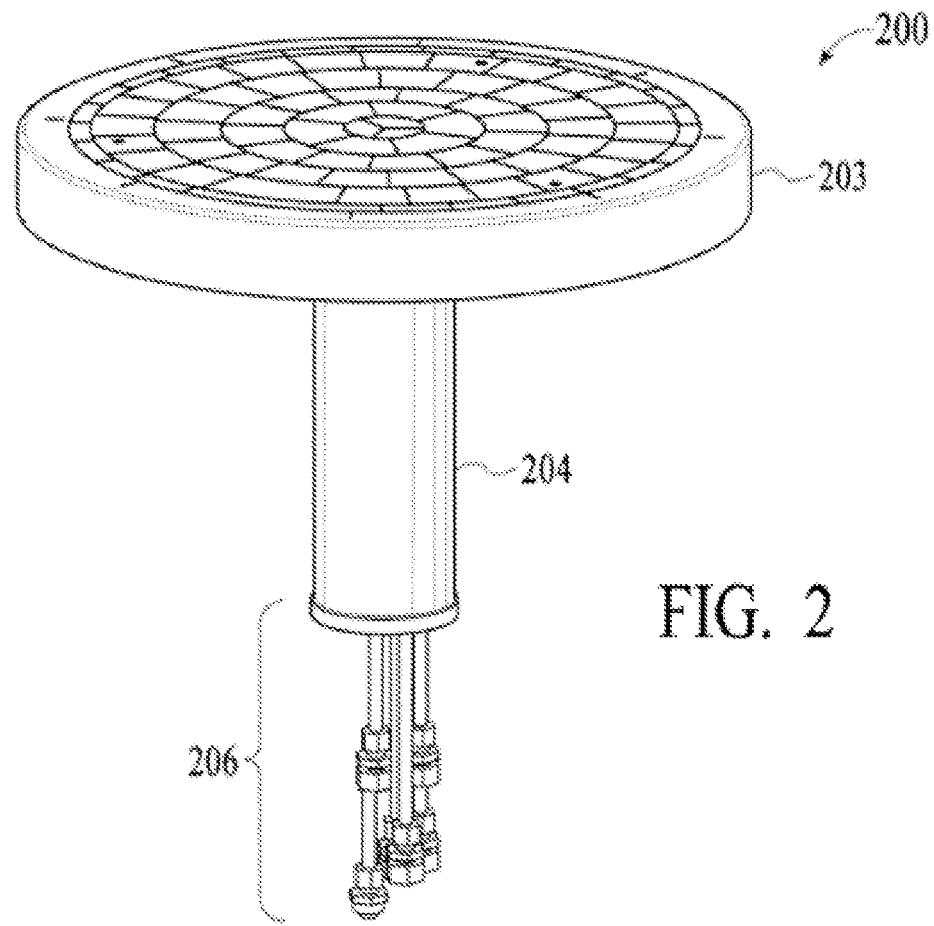
FIG. 2 illustrates a perspective view of a pedestal assembly with a multi-zone pedestal heater according to embodiments of the present technology.

FIG. 2 shows an alternate configuration of a substrate support assembly 126. This substrate support assembly 200 has a pedestal heater assembly 203 at the top and a shaft 204 at the bottom. Electrical connections 206 couple the heating elements in the pedestal heater assembly 203 to an external temperature controller (such as a control interface printed circuit board (PCB), as described in greater detail in FIG. 5).

Figure 3:
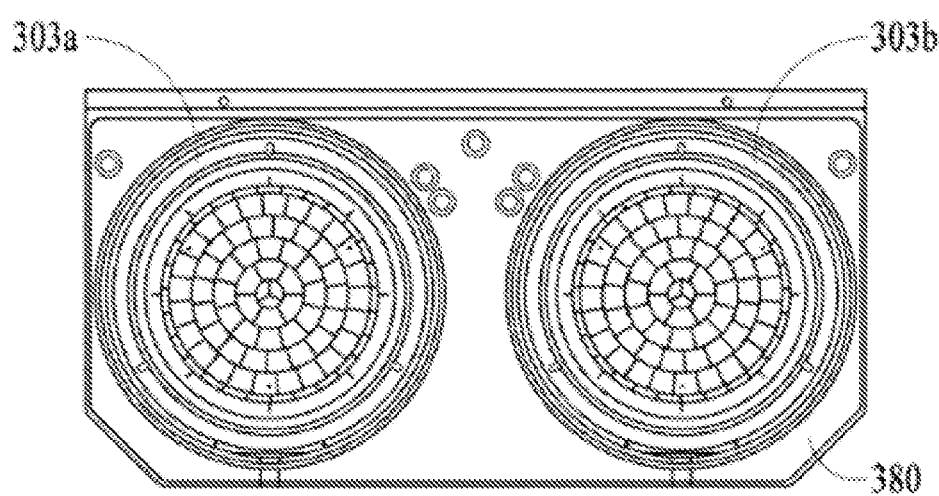
FIG. 3 shows a top-down view of a facility plate containing two multi-zone pedestal heaters disposed side by side, according to an embodiment of the present technology.

FIG. 3 shows a top view of a facility plate 380 containing two multi-zone pedestal heaters 303*a* and 303*b* disposed side by side, according to an embodiment of the present disclosure. For instance, as noted above, in embodiments, processing chamber 208 may include more than one pedestal. Thus, in embodiments the facility plate 180/380 may contain a number of multi-zone pedestal heaters 303a-x corresponding to the number of pedestals in the processing chamber.

Figure 4:
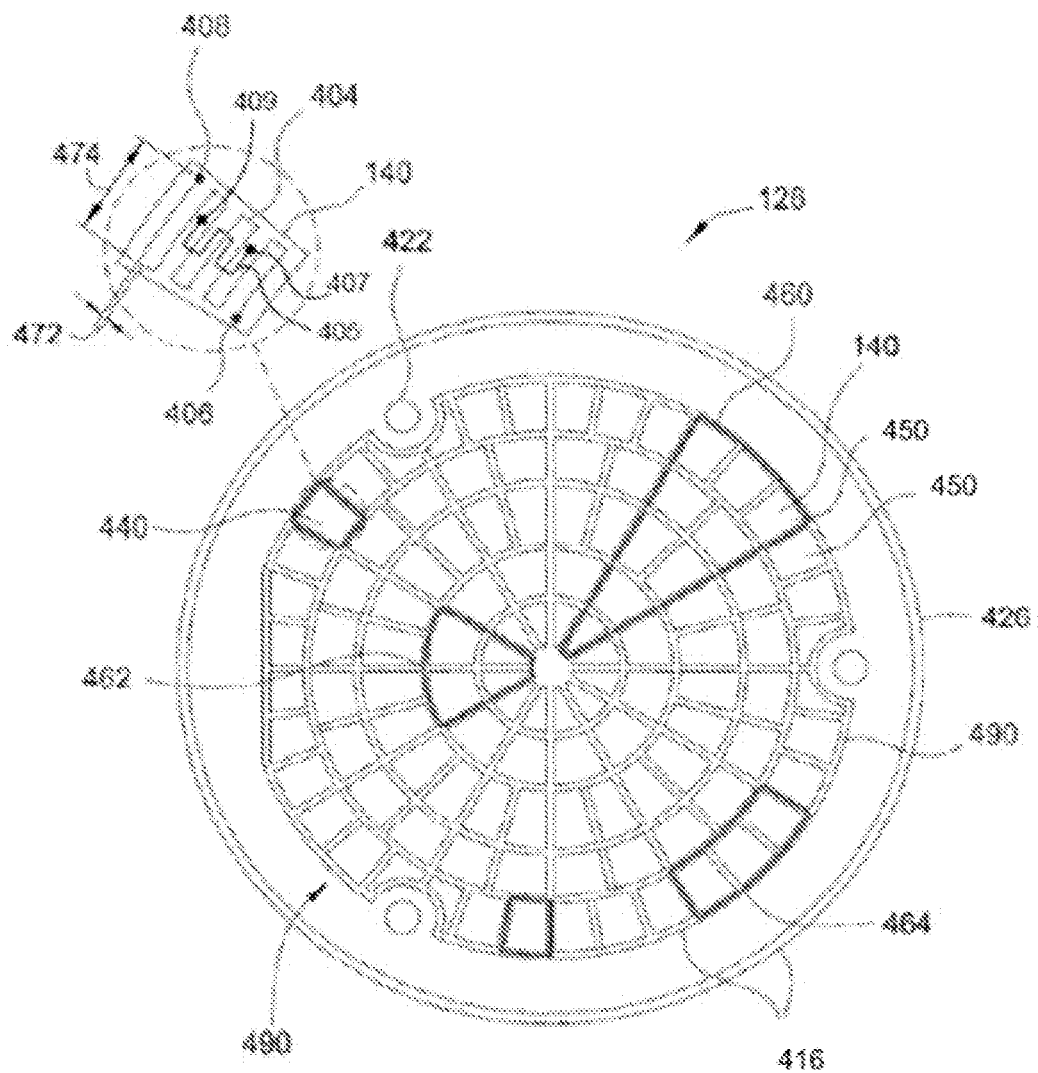
FIG. 4 illustrates a top-down view of a multi-zone pedestal heater according to embodiments of the present technology.

FIG. 4 illustrates a sectional top-down view through the body 152 of the pedestal heater assembly 170, showing the spatially tunable heaters 140 from the top. The pedestal heater assembly 170 may include a plurality of spatially tunable heaters 140 that effectuates heat transfer between the pedestal heater assembly 170 and substrate support 132. Each spatially tunable heater 140 may be laterally arranged across the pedestal heater assembly 170 and defines a zone 450 within the pedestal heater assembly 170 for locally providing additional heat to a region of the pedestal heater assembly 170 (and a portion of the main resistive heater 154) aligned with that zone 450. It is contemplated that there may be hundreds of spatially tunable heaters 140 in a given embodiment of a substrate support assembly 126 configured for use with a full substrate, e.g., a 300 mm substrate. However, as discussed above, in embodiments, processes and methods discussed herein may be utilized with pedestal heating assemblies 170 having only one zone, or such as greater than or about 2 zones, such as greater than or about 3 zones, such as greater than or about 4 zones, such as greater than or about 5 zones, such as greater than or about 6 zones, such as greater than or about 7 zones, such as greater than or about 8 zones, such as greater than or about 9 zones, such as greater than or about 10 zones, such as greater than or about 25 zones, such as greater than or about 50 zones, such as greater than or about 100 zones, such as greater than or about 200 zones, such as greater than or about 250 zones, such as greater than or about 300 zones, or any ranges or values therebetween. Namely, as noted above, the process and methods of the present technology may provide improved control of one or more targeted substrate properties regardless of the number of zones but can also drastically reduce the time necessary to determine necessary pedestal properties for achieving targeted substrate property profiles with heating assemblies have large numbers of zones.

The pedestal heater assembly 170 may further include a plurality of temperature sensors. Each temperature sensor may be laterally arranged across the pedestal heater assembly 170 such that each temperature sensor is within a zone 450 in the pedestal heater assembly 170 defined by a spatially tunable heater 140. Each temperature sensor may measure the temperature of the zone 450 that it is disposed in and/or determine an operability of the spatially tunable heater 140 in that zone 450. Additionally, one or more temperature sensors that are in a zone defined by a main resistive heater 154 may be used to measure a temperature of the zone and/or to determine an operability of the main resistive heater 154. By individually and independently correcting the power provided to each spatially tunable heater 140, and consequently the heat transfer through zone 450, a pixel-by-pixel approach to pedestal temperature control can be realized which enables specific points of the substrate 134 to be heated or cooled, enabling a truly addressable lateral control of the surface of the substrate 134.

The pedestal heater controller 178 may regulate the temperature of the spatially tunable heaters 140 in the pedestal heater assembly 170 at each zone 450 relative to the other zones 450. Alternatively, the pedestal heater controller 178 regulates the temperature of a group of spatially tunable heaters 140 in the pedestal heater assembly 170 across a group of zones 450 relative to another group of zones 450. The pedestal heater controller 178 may toggle the on/off state and/or control a duty cycle for individual spatially tunable heaters 140. Alternately, the pedestal heater controller 178 may control the amount of power delivered to the individual spatially tunable heaters 140.

In one embodiment, the controller 148 receives temperature measurements from the plurality of temperature sensors. The controller 148 may receive each temperature measurement as a resistance measurement in one embodiment. The heater controller 148 may then convert the resistance measurement to a temperature measurement based on a resistance to temperature conversion table. A separate resistance to temperature conversion table may be used for each temperature sensor. Alternatively, the same resistance to temperature conversion table may be used for multiple temperature sensors. The resistance to temperature conversion tables may be generated by performing a calibration of the temperature sensors.

In one embodiment, each zone 450 may be thermally isolated from the neighboring zones 450, for example, using a thermal choke 416, which enables more precise temperature control. In another embodiment, each zone 450 may be thermally joined to an adjacent zone creating an analogue (i.e., smooth or blended) temperature profile along an upper surface of the pedestal heater assembly 170. Namely, in embodiments, as will be discussed in greater detail below, systems and methods according to the present technology may utilize sophisticated controls to modulate the targeted temperature of adjacent zones of the pedestal heater to achieve a tailored profile of one or more substrate properties across the substrate. Such control is also advantageous, as power saturation of a single zone or multiple zones can be minimized and instead leverage the power of an adjacent zone when a target zone is already at a maximum or minimum power.

In embodiments, each spatially tunable heater 140 has a resistor 404 ending in terminals 406, 408. As current enters one terminal, such as the terminal labeled 406, and exists the other terminal, such as the terminal labeled 408, the current travels across the wire of the resistor 404 and generates heat. The amount of heat released by the resistor 404 is proportional to the square of the current passing through that resistor.

The spatially tunable heaters 140 may be configured in a pattern 490 to efficiently generate a heat profile along the surface of the substrate support assembly 126. The pattern 490 may be symmetric about a midpoint while providing clearance in and around holes 422 for lift pins or other mechanical, fluid or electrical connections. Each spatially tunable heater 140 may be controlled by the controller 148, alone or via pedestal heater controller 178. The controller 148/pedestal heater controller 178 may turn on a single spatially tunable heater 140 defining a heater 440; or a plurality of spatially tunable heaters 140 grouped to define an inner wedge 462, a perimeter group 464, a pie shaped area 460, or other geometric configuration, including non-contiguous configurations. Although the pattern shown is comprised of smaller units, the pattern may alternatively have larger and/or smaller units, extend to the edge, or have other forms. For instance, the spatially tunable heaters 140 may be arranged in the form of a grid, defining an array of temperature control zones 450 also arranged in an x-y grid pattern, a polygonal pattern (e.g., a hexagonal close pack), a polar array pattern, in concentric channel pattern. It should be appreciated, as discussed above, that the spatially tunable heaters 140 may be activated in groups or singularly.

In embodiments, substrate support 126 may include one or more temperature sensors 405. The one or more temperature sensors 405 are positioned above or below the spatially tunable heater 140. As shown, the temperature sensor 405 in most cases will be smaller than the spatially tunable heater 140. The temperature sensor 405 may end in terminals 407 and 409. A current may be sent through the temperature sensor 405 via the terminals, and a resistance of the temperature sensor 405 may be measured to determine a temperature of the spatially tunable heater 140. The material, length of wire, and the wire thickness for the temperature sensor 405 may be selected for to control a temperature range over which the temperature sensor 405 is sensitive. However, in embodiments, other temperature sensors may be utilized as known in the art.

The number and density of the spatially tunable heaters 140 may contribute to the ability to control a targeted substrate property at various points across the substrate surface. Additionally, individual correction of the target temperature of one spatially tunable heater 140 relative to another spatially tunable heater 140 enables control of the targeted substrate property at corresponding locations on the substrate surface without substantially affecting the temperature of neighboring areas, unless desired. Namely, in embodiments, and depending on the process recipe, chamber conditions, targeted substrate property, and the amplitude of the corrections, the corrections of the target temperature or power of one spatially tunable heater 140 may produce a lateral effect on the substrate that extends to neighboring regions of the substrate beyond the area of the substrate directly above the region controllable by that spatially tunable heater. Such a lateral dependency among neighboring regions of the substrate is referred to as horizontal effect, whereas the effect produced by a spatially tunable heater 140 onto the region of the substrate immediately above the spatially tunable heater 140 is referred to as vertical effect. To regulate the targeted substrate property to a certain target profile across the substrate, in embodiments, a controller accounts for not just the vertical but also the horizontal effects of subsequent corrections. Thus, in embodiments, the spatially tunable heaters 140 allow both lateral and vertical tuning of the targeted substrate property of a substrate 134 processed on the substrate support assembly 126. Namely, as should be understood, while "a targeted substrate property" is discussed herein, the targeted substrate property may vary depending upon the selected point or region across the substrate surface, and thus, a targeted substrate property may be independently controlled to be the same value or different values at spaced apart locations on the substrate, based upon a substrate target profile discussed in greater detail below.

Figure 5:
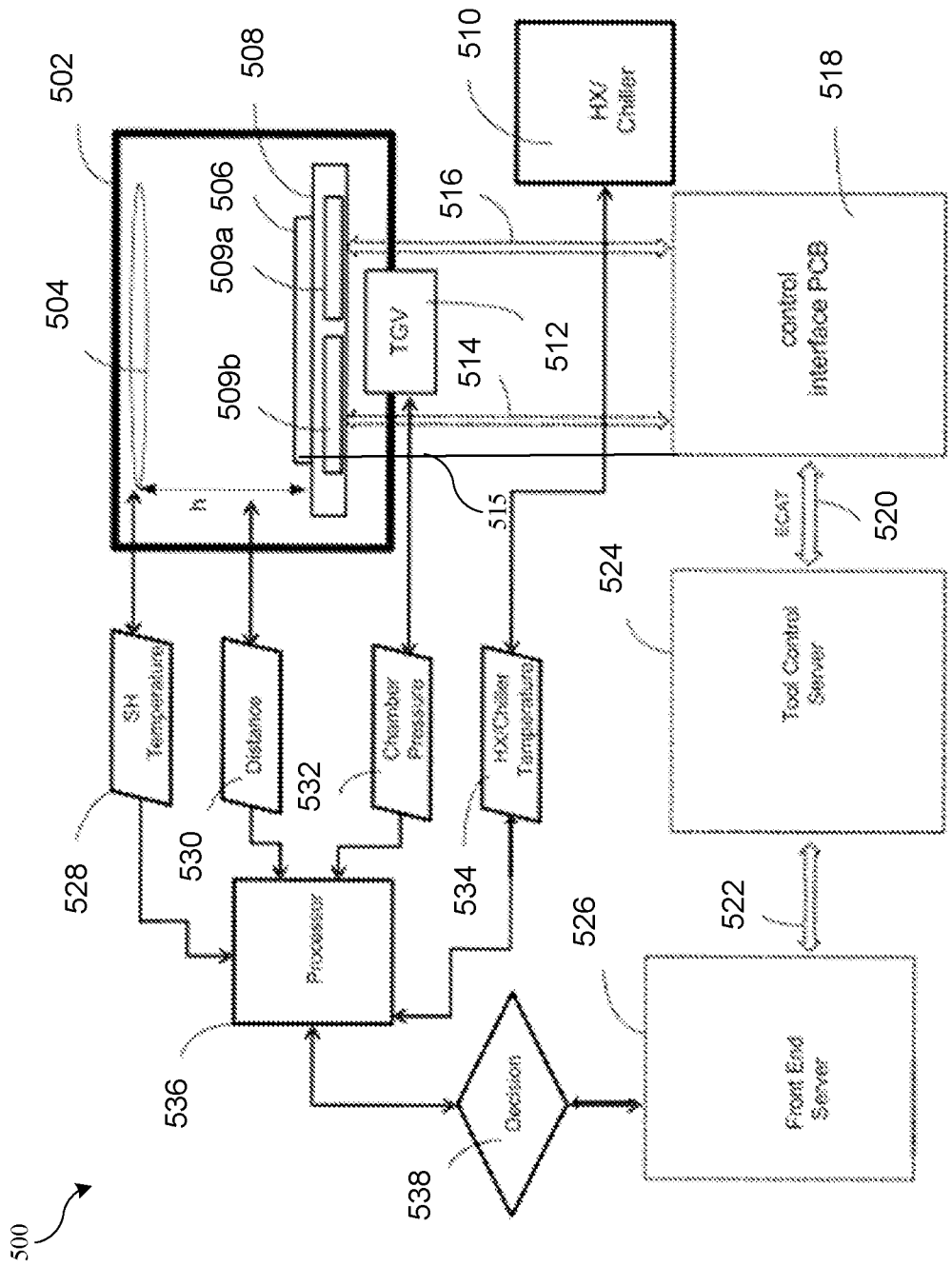
FIG. 5 illustrates a schematic block diagram of a system according to embodiments of the present technology.

FIG. 5 shows a block diagram representing the substrate control architecture and functionalities of system components in systems and methods according to the present technology, which enable closed-loop substrate control. Exemplary process signals that may be collected by the system 500 from the chamber 502 include, but are not limited to, temperature 528 of the showerhead 504, the distance 530 (shown as 'h') between a showerhead and the substrate support assembly 508 (that includes a pedestal as discussed above), and chamber pressure 532, as supplied by the throttle gate valve 512.

The substrate 506 is heated by multi-zone pedestal heaters 509a and 509b that are integrated into the substrate support assembly 509 as discussed above. Temperature data from one or more temperature sensors on the substrate 506 (which will be discussed in greater detail below), or on substrate support 509, or on both the substrate 506 and substrate support 509, which may be any temperature sensor discussed above, is communicated to the control interface module 518 via communication links 514, 515, and/or 516. Additionally or alternatively, metrology data, such as thickness of one or more layers across a substrate, etch depth, or the like may be transmitted to processor 536 via ECAT from the front-end server 526 when metrology data are imported into system 500 from other chambers embedding on-board metrology capabilities, or one or more communication links. The control interface module functionalities for pedestal heaters 509a and 509b may be carried out by a circuit board within the module 518. The module 518 is communicatively coupled with a front-end server 526 either directly or through a tool control server 524. In an embodiment, front-end server 526, tool control server 524, and module 518 may be coupled via communication links 520 and 522.

A processor 536 can execute a closed-loop substrate control algorithm based on real-time input collected from the chamber 502. Additional input may be collected from other hardware outside of the chamber, such as the heat-exchanger (HX)/chiller 510, and the front-end server 526. The HX/chiller 510 may provide temperature data 534 to the processor, and the closed-loop substrate control algorithm residing within processor 536 may provide a HX/chiller target temperature 534 to the HX/Chiller 510. However, in embodiments, the HX/Chiller temperature may be corrected by the substrate control algorithm (e.g. treated as one or more heating zones) regardless of any temperature data provided to the processor. Nonetheless, it should be clear that, in embodiments, the processor 536 is part of a substrate control architecture, not a separate processor for the substrate control system discussed herein.

In embodiments, processor 536 also includes one or more machine learning algorithms. In embodiments, a machine learning algorithm, such as a substrate modeling algorithm 613b (discussed in greater detail below in regards to FIG. 6), is utilized to model the targeted substrate property, and also thus utilized to regulate the targeted substrate property to a desired substrate target profile. The modeling process begins with the generation of appropriate tests (one or more modeling tests) performed on the substrate in processing chamber 502. The results of such tests are provided to the processor 536 and utilized by the machine learning algorithm running within controller 148 to generate a characterization of the thermal or structural effects of heating zones within the substrate support, as well as other chamber conditions and factors, on a region or portion of the substrate. In embodiments, the processor may select one or more modeling tests based upon the initial substrate feedback, namely information about the targeted substrate property during the previous substrate processing recipe, which may include substrate temperature data, data relating to thickness of one or more layers across a substrate, substrate etch depth data, the like, or combinations thereof. Moreover, in embodiments, only a portion of the substrate may be modeled, such as, in embodiments, a portion of the substrate that exhibited one or more properties that vary from a substrate target profile in that portion. However, it should be understood that, in embodiments, the entire substrate is modeled regardless of the initial substrate feedback.

In embodiments of the present technology, and unlike conventional processes and methods, the substrate model derived by the substrate modeling algorithm 613b contains information of the vertical and horizontal effects, where the vertical effect corresponds to the local effect produced by one or more spatially tunable heaters 140 onto the substrate 506, and the horizontal effect represents the lateral dependency of a point or region on the substrate 506 from the neighboring points or regions on the substrate 506. Both vertical and horizontal effects embed information about the load on the substrate imposed by chamber conditions including but are not limited to temperature 528 of the showerhead 504, the distance 530 between a showerhead and the substrate support assembly 508, and chamber pressure 532. In addition, both vertical and horizontal effects depend on the process recipe parameters including but not limited to the dosing scheme of gasses injected into the chamber 502 through the showerhead 504, and in general, the chemical reactions occurring within the chamber 502. Moreover, the vertical and horizontal effects depend on the properties of the substrate itself, which may be affected by unexpected chamber-to-chamber differences, and pedestal-to-pedestal differences. Thus, the vertical and horizontal effects provide an individualized characterization of the substrate model in relation to chamber, pedestal heater, and process recipe. Therefore, unlike conventional processes and methods, the substrate model derived with the methods in the present technology are specific to the chamber, pedestal, substrate, and process recipe under analysis. Moreover, unlike conventional processes and methods, the methods in the present technology allow the generation of an in-situ model of the substrate, thus not requiring extensive and extremely complex preliminary engineering models of the substrate under nominal conditions and on a single nominal chamber. Thus, in embodiments, regulating the targeted substrate property to a certain target profile across the substrate 506, may require a controller to account for not just the vertical but also the horizontal effects of subsequent corrections.

Moreover, unlike conventional modeling techniques that are performed offline, the modeling process utilized herein and embedded within processor 536 allows substrate models to be quickly generated without user intervention. In embodiments, the system may prompt a user to confirm that it is acceptable to run the modeling tests (e.g. confirm that an appropriate substrate is placed within the chamber), but that user intervention is not necessary for the selection and performance of the modeling test. In embodiments, the substrate model may also be obtained in parallel, instead of in series, on multiple chambers and/or on two or more substrate support assemblies 508, within the same chamber, thus significantly increasing the speed of the modeling process despite the undesired presence of chamber-to-chamber and/or pedestal-to-pedestal differences. Additionally or alternatively, the substrate model can be shared amongst adjacent heaters, and/or even heaters in other chambers, without requiring user intervention. The result of the modeling process is a substrate model that is subsequently utilized by a further machine learning algorithm, namely, the substrate control algorithm 613a (which will be discussed in greater detail in regards to FIG. 6 below), to generate corrections of targeted pedestal temperature and HX/chiller coolant temperature, to ensure that all or portions of the substrate feedback approach, or reach, the respective targeted substrate property of the substrate target profile.

A server (which could be a tool control server 524) contains a controller (such as controller 148) that is configured to conduct chamber processes and control various chamber hardware including the temperature of various heating zones via control module 518. Controlling chamber hardware may include controlling heater electronics to deliver targeted amounts of power to or correction of a targeted heater temperature of one or more heating zones independent of other heating zones. Controlling chamber hardware may also include controlling the HX/chiller temperature, as the pedestal heater temperature may be a function of both heater power and coolant flow in embodiments.

For example, if a zone or a set of zones becomes too hot, colder fluid may need to be supplied to bring down the average temperature of the pedestal heater to the targeted value and less power needs to be delivered to the heater in that zone or zones. On the other hand, if a zone or zones becomes too cold, hotter fluid needs to be supplied to bring up the average temperature of the pedestal heater and more power needs to be delivered to the heater in that zone or zones.

In embodiments, when the targeted substrate property is the thickness of one or more layers across a substrate, etch depth, or a combination thereof, and when the system includes one or more chambers with on-board metrology functionality, or where the targeted substrate property is temperature as discussed above, it should be clear that the methods to attain substrate feedback can be integrated into the one or more control servers of the system 500. Thus, unlike conventional systems which require the substrate to be removed and analyzed, the present technology can be used in conjunction with on-board metrology chambers to continuously review and update processing parameters that form the processing recipe. In turn, the continuous review and update of processing parameters further decreases the time necessary for modeling and control steps and requires little to no user intervention.

Figure 6:
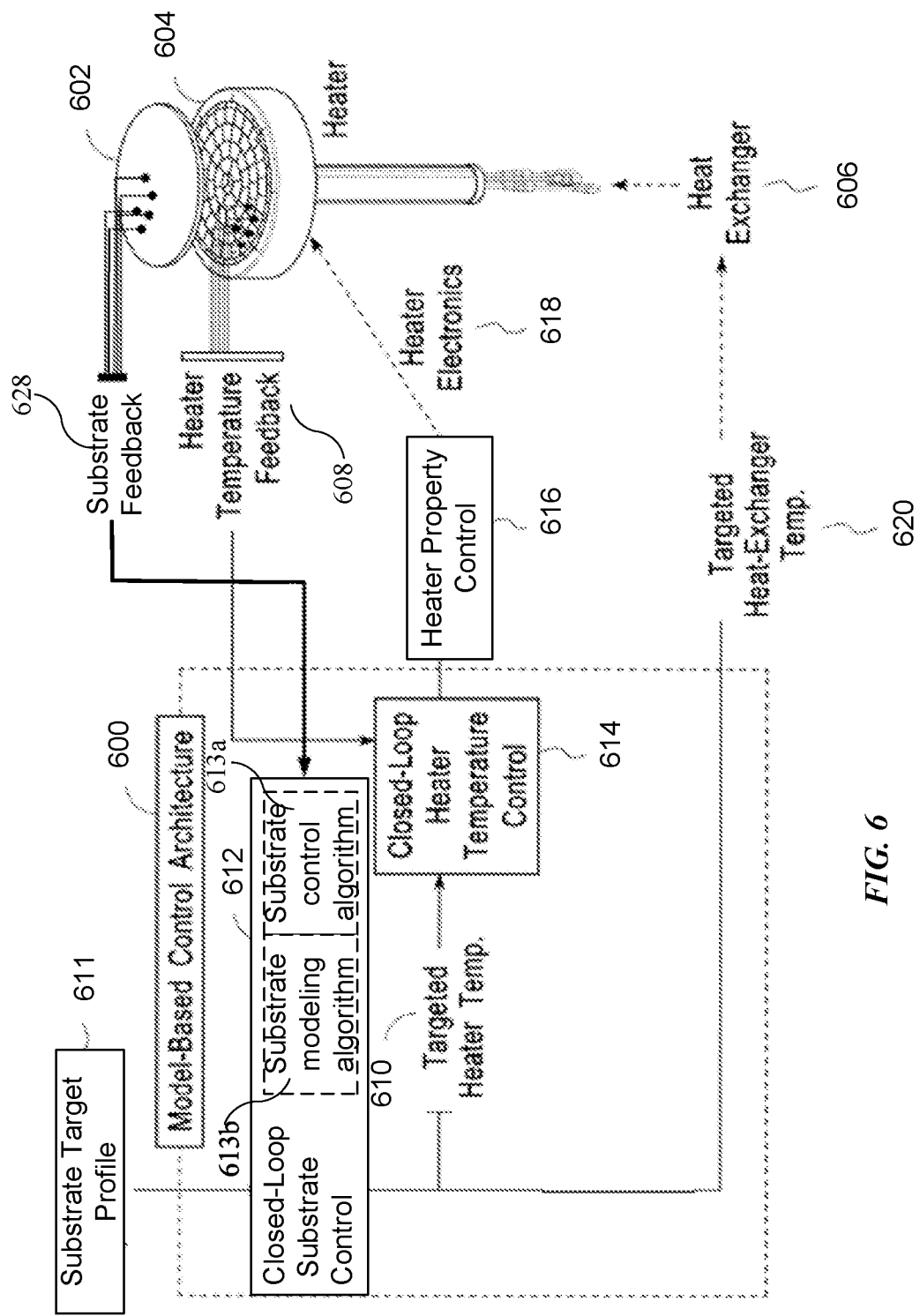
FIG. 6 illustrates a schematic block diagram of a substrate control architecture according to embodiments of the present technology.

FIG. 6 illustrates further details of a model-based substrate control architecture 600 implemented by the system shown in FIG. 5 for independently controlling the substrate and each of the zones of the multi-zone pedestal heater(s). As shown in FIG. 6, a substrate 602 is placed on a pedestal 604 with one or more multi-zone heaters, according to any one or more of the above embodiments. In embodiments, the substrate 602 may be a substrate as illustrated in FIG. 7A and/or FIG. 7B or may be any substrate known in the art depending upon the targeted substrate property.

Figure 7A:
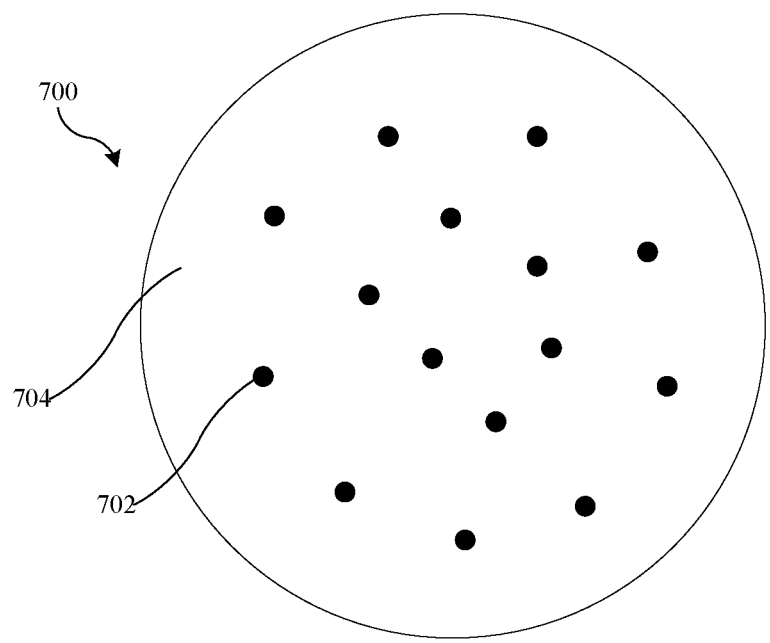
FIGS. 7A and 7B illustrate top-down views of a substrate according to embodiments of the present technology.
Figure 7B:
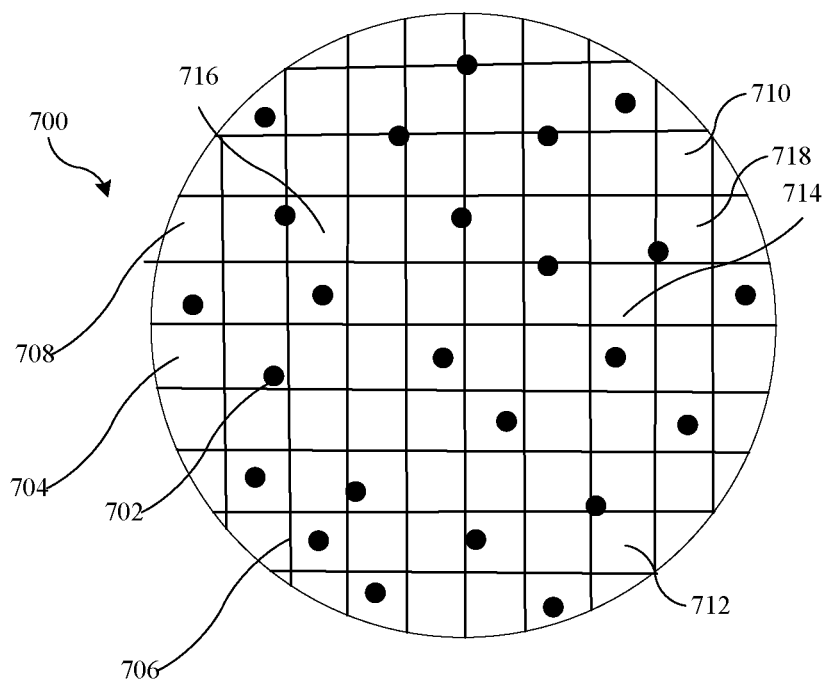

As illustrated in FIGS. 7A and 7B, in embodiments, the substrate 700 may contain one or more temperature sensors 702, when one or more of the targeted substrate properties is temperature data. In embodiments, the substrate 700 may contain one temperature sensor, such as greater than or about 2, such as greater than or about 3, such as greater than or about 4, such as greater than or about 5, such as greater than or about 6, such as greater than or about 7, such as greater than or about 8, such as greater than or about 9, such as greater than or about 10, such as greater than or about 11, such as greater than or about 12, such as greater than or about 13, such as greater than or about 14, such as greater than or about 15, such as greater than or about 20, such as greater than or about 25, such as greater than or about 30, such as greater than or about 40, such as greater than or about 50 temperature sensors 702, or any ranges or values therebetween.

Regardless of the number of temperature sensors 702, the temperature sensors may be arranged randomly across the substrate 700, or may be evenly spaced apart across substrate 700, or arranged concentrically around substrate 700. In embodiments, the temperature sensors 702 may be disposed on a surface 704 of the substrate 700, such as a surface opposed to a surface disposed on the pedestal, which may also be referred to as the work surface. Additionally or alternatively, in embodiments, the temperature sensors may be disposed between surface 704 and the opposing surface (e.g., disposed within substrate 700, shown more clearly as first surface 135 and second surface 137 in FIG. 1B). In embodiment, the number of temperature sensors 702 and/or horizontal location of the temperature sensors 702 may correspond with the number and/or horizontal location of the heaters 140 or groupings thereof (e.g., 440, 460, 464). However, in embodiments, the temperature sensors 702 may be disposed across the substrate 700 notwithstanding the horizontal location or number of heaters on the pedestal.

In embodiments, the temperature sensors 702 may be configured to efficiently measure a heat profile along the surface of the substrate 700. The pattern may be symmetric about a midpoint in embodiments, or may define wedges, surround a perimeter group, or other geometric configuration, including non-contiguous configurations. Although the pattern shown is comprised of smaller units, the pattern may alternatively have larger and/or smaller units, extend to the edge, or have other forms. For instance, the temperature sensors 702 may be arranged in the form of a grid, defining an array of measurement regions also arranged in an x-y grid pattern, a polygonal pattern (e.g., a hexagonal close pack), a polar array pattern, in concentric channel pattern.

For instance, as illustrated in FIG. 7B, a superimposed x-y grid 706 divides substrate 700 into a plurality of regions 708. It should be understood that grid 706 is not physically formed on substrate 700 and is instead illustrated to visualize the potentially infinite number of spaced apart and adjacent regions of, or points on, substrate 700. In embodiments, each region may have a temperature sensor 702 disposed therein, or only a portion of the regions may have a temperature sensor 702 disposed therein. Moreover, while FIG. 7B illustrates an x-y grid, it should be understood that, in embodiments, the grid may be symmetric around a midpoint, such as a pattern illustrated on the substrate support (pedestal) 126 of FIG. 4. Nonetheless, it should be clear that in embodiments, a first region 710, which may be a targeted region (e.g. a region selected for control of a targeted substrate property) as discussed in greater detail below, may be spaced apart from a second region 712, a third region 714, and a fourth region 716, which are also spaced apart from one another. In addition, fifth region 718 illustrates a region directly adjacent in the x-y plane of the substrate to first region 710. Thus, it should be clear that other unlabeled regions may be described in their relationship to one another across the surface 704 or within substrate 700. In addition, in embodiments, each region may be small enough to be considered to be a single point on or within substrate 700.

Nonetheless, the temperature sensors 702 may be wireless communication devices. The temperature sensors 702 may be radio-frequency devices, in embodiments. For instance, in embodiments the temperature sensors 702 may use RFID communication technology to communicate with control module 518. In embodiments, only a first substrate utilized to perform the modeling and control functions may include one or more temperature sensors 702. However, in embodiments, each substrate may be configured to sense and transmit temperature data of a location on the substrate and may further transmit information identifying the temperature sensor 702 so as to associate the temperature information with a specific location on the substrate 700.

Regardless, in embodiments, the targeted substrate property may be any property other than temperature, or in addition to temperature. In such an embodiment, any substrate as known in the art may be utilized as the substrate 602. However, it should be understood that, in embodiments, the substrate 602 should be selected as a representative of the substrates desired to be processed on the pedestal 604 being modeled. Namely, as noted above, the present technology provides for the optimization of a recipe on a pedestal-to-pedestal, side-to-side, and/or chamber-to-chamber basis between a specific pedestal/chamber and substrate.

Therefore, in embodiments, the substrate should be selected so as to be similar, or generally identical, in size, shape, and/or material to the desired substrates to be processed.

Notwithstanding the substrate selected, in embodiments, the targeted substrate property may be etch depth, thickness of one or more layers across a substrate, deposition thickness, combinations thereof, or other similar substrate properties. Namely, it is known in the art that substrate temperature can contribute to etch and deposition uniformity. Thus, in embodiments, the initial substrate feedback and the targeted substrate property can be one or more of etch depth, thickness of one or more layers across a substrate, the like, or combinations thereof, but the correction is targeted heater temperature or heater power. As known in the art, a series of differential equations can be utilized to determine a heater temperature or power necessary to influence an etch or deposition amount. Thus, in embodiments, controller 148 and processor 536 may also include one or more machine learning algorithms to convert initial substrate data into corrective power or temperature outputs, such as table values discussed above. In embodiments, etch and deposition measurements may be conducted by in-unit or in-chamber metrology systems, or may be done in an adjacent chamber of system 100, or may be conducted externally to system 100.

Figure 8:
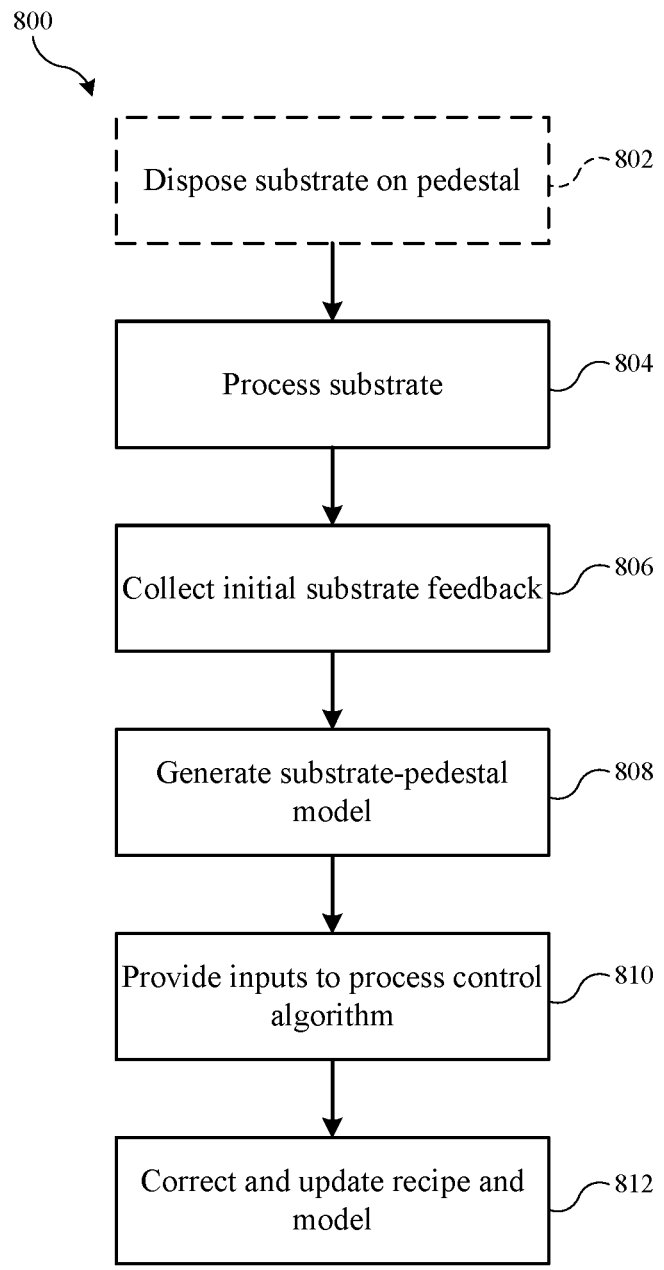
FIG. 8 shows selected operations in a method according to embodiments of the present technology.

Embodiments of the above-described systems and methods may be present in a chamber or system that exhibits improved substrate control, such as improved regulation of the targeted substrate property during processing, as discussed herein. FIG. 8 shows exemplary operations in a method 800 of increasing substrate processing regulation. The method 800 may also include one or more operations prior to the initiation of the method, including cleaning, deposition, or any other operations that may be performed prior to the described operations. The method may further include a number of optional operations, which may or may not be specifically associated with some embodiments of methods according to the present technology. For example, many of the operations are described in order to provide a broader scope of the processes performed but are not critical to the technology or may be performed by alternative methodology, as will be discussed further below.

Method 800 may include operations described schematically in FIGS. 5 and 6, as discussed above, for improving substrate processing regulation from pedestal-to-pedestal, side-to-side, and/or chamber-to-chamber during one or more substrate processing operations. For instance, method 800 includes an operation 802 that includes disposing a substrate 602 on a pedestal 604, such as any one or more of the pedestals discussed above having two or more heating zones. In embodiments each heating zone may an independent heater, as well as an independent temperature sensor. In embodiments the substrate 602 may contain one or more feedback sensors, where each feedback sensor can be any sensor or data point providing feedback about the value of the targeted substrate property at the location of the sensor. The feedback sensors may align with various regions of pedestal 604 or may be randomly spaced apart in some embodiments. In embodiments, the feedback sensors are temperature sensors located on the substrate as previously described. However, in embodiments, the substrate feedback 628 may instead be metrology data, such as thickness of one or more layers across a substrate, etch depth, deposition depth, or the like located at one or more points or zones of substrate 602.

Nonetheless, in embodiments, the substrate 602 is subjected to one or more processing steps at an operation 804 based upon an initial substrate processing recipe. In embodiments, the initial substrate processing recipe is based on substrate processing requirements, and is selected based upon an engineering first principle, or a standard recipe based upon the substrate, chamber, and/or process(es), selected. Processing steps can include etching, deposition, polishing, cleaning, combinations thereof, and the like. In embodiments, the one or more processing steps include at least one or deposition and etching, alone or in combination with other processing steps. Regardless of the one or more processing steps selected, the targeted pedestal heater temperature 610 and the targeted temperature of the HX/chiller, via heater property control 616, heater electronics 618, and/or heat exchanger 606, are set to an initial temperature. The initial pedestal temperature and the initial HX/chiller temperature may be randomly selected within a range suitable for the initial substrate processing recipe or may be recommended temperature values based upon an engineering first principle for the specific pedestal, side, process requirements, and/or chamber.

Namely, in embodiments, the heater electronics 618 provides power to the heaters to achieve independent control of the one or more heating zones. If necessary, the heat exchanger/chiller 606 supplies a fluid to maintain the pedestal temperature within a certain operating average temperature. In embodiments, the initial pedestal temperature is a uniform temperature profile across the pedestal. Real-time temperature data 608 collected during processing operation 804 from the pedestal temperature sensors is provided to the closed-loop heater temperature control algorithm 614.

Notwithstanding the one or more processing steps or temperature selected, the method collects initial substrate feedback 628 at operation 806. The initial substrate feedback includes data representing one or more substrate properties. For instance, in embodiments, the one or more substrate properties can include substrate temperature, thickness of one or more layers across a substrate, etch depth, deposition thickness, the like, or combinations thereof. In embodiments, such substrate properties, and the data representative thereof may be obtained from one or more metrology systems. In embodiments, one or more metrology systems may be integrated into the processing system, such as processing system 100, or may be external to the processing system (e.g. removing the substrate for testing and importing the measured data). Namely, while the collection of temperature has thus far been discussed separately from other substrate properties, it should be clear that a substrate including one or more temperature sensors, such as 702 of FIGS. 7A and 7B, may be utilized to collect temperature data and may also be subjected to metrology testing. In embodiments, therefore, the one or more temperature sensors (e.g., 702), may be disposed in non-processing areas of the substrate (e.g., 602 in FIG. 6 and/or 700 in FIGS. 7A and 7B).

The initial substrate data is then used in one or more ways to tailor method 800 to the specific pedestal, chamber, and/or side. For instance, as noted above, the substrate control architecture 600, which may be integrated into controller 148 and/or processor 536 contains one or more modelling tests illustrated in the substrate modeling algorithm 613b within closed-loop substrate control 612, based upon the initial substrate feedback and/or initial substrate and/or chamber conditions. In embodiments, the processor 536 may not utilize the initial substrate feedback to select one or more modelling tests for use in the substrate modeling algorithm 613b and may instead proceed to model all or a portion of the interactions between substrate 602 and pedestal 604 without consideration of the initial substrate feedback. However, in embodiments, the substrate control architecture 600 obtains the initial substrate feedback 628 from substrate 602 and utilizes the initial substrate feedback 628 in order to select one or more modeling tests.

In such an embodiment, the substrate control architecture 600 may select modeling tests to be performed on one or more substrate regions that require pedestal heater temperature or power changes, namely substrate regions that have substrate feedback that varies from the substrate target profile 611 in the respective region by an amount greater than a predetermined level. In embodiments, the predetermined level may be due fully or in part to noise, and the predetermined amount may therefore be greater than or equal to a noise value. Additionally or alternatively, in embodiments the predetermined amount may be a difference between the substrate feedback and the targeted substrate feedback of greater than or about 1%, such as greater than or about 2%, such as greater than or about 3%, such as greater than or about 4%, such as greater than or about 5%, such as greater than or about 6%, such as greater than or about 7%, such as greater than or about 8%, such as greater than or about 9%, such as greater than or about 10%, such as greater than or about 11%, such as greater than or about 12%, such as greater than or about 13%, such as greater than or about 14%, such as greater than or about 15%, or any ranges or values therebetween. However, as noted above, in embodiments, one or more models may be obtained that model all or a random selection of points along the substrate surface, regardless of the initial substrate feedback.

In embodiments, some or all of the variation of the targeted substrate property to the substrate target profile may be due to noise. In such embodiments, noise may be determined during the initial feedback or modeling operations and may be defined as changes in feedback between subsequent testing or modeling operations where no changes in processing were made. Thus, noise may be differences in signal or feedback due to measurement sensitivity, processing inconsistencies, or the like. Nonetheless, in embodiments, computation of a substrate feedback noise level may be based on comparisons among the initial substrate feedback and the substrate feedback data deriving from the one or more modeling tests. In embodiments, the feedback noise level is included as part of the substrate model provided by the substrate modeling algorithm to the substrate control algorithm. Thus, in embodiments, the one or more iterations may stop updating the processing recipe upon obtaining substrate feedback any one or more of the above variations ranges between the targeted substrate property and the substrate target profile, as the variation may be cause all or partly by noise.

In embodiments, only one modeling test may be selected by the substrate control architecture, or more than one modeling test may be selected, such as greater than or about two, such as greater than or about 3, such as greater than or about 4, such as greater than or about 5, such as greater than or about 6, such as greater than or about 7, such as greater than or about 8, such as greater than or about 9, such as greater than or about 10 modeling tests, or any ranges or values therebetween. Nonetheless, the one or more modeling tests are utilized (such as aggregated if more than one test) to provide a substrate model for the tested substrate and pedestal at operation 808.

As noted above, due to the significant improvement in efficiency and customization of the present technology, the processes and methods discussed herein may be conducted for each pedestal in a chamber, in a plurality of chambers.

However, in embodiments, the substrate model may be utilized for each pedestal in a chamber, or for each chamber side in a plurality of chambers (e.g., utilize the model for similarly situated pedestals in adjacent chambers or in a plurality of similarly formed chambers). Moreover, while the methods and systems have been discussed as utilizing a single pedestal, it should be understood that systems and methods as discussed herein are also suitable for use when the chamber includes more than one pedestal, or for conducting testing on one or more separate chambers containing one or more pedestals. In such embodiments, the methods 800 and systems discussed herein may be run simultaneously on each pedestal or on each chamber or may be run sequentially. Nonetheless, it should be clear that multiple pedestals 604 and substrates 602 may be controlled simultaneously with the substrate control architecture 600 according to embodiments herein. In one such embodiment, the modeling tests and substrate model may be conducted individually based upon the respective substrate and substrate feedback and may therefore provide alternative control and ultimately potentially different recipes for each pedestal, chamber, and/or side tested, in order to provide customized substrate control and regulation.

Thus, in embodiments, the substrate feedback corresponding to the one or more modeling tests performed on each specific pedestal, chamber, and/or side, may be provided to the substrate modeling algorithm 613b sequentially, or simultaneously. This provides further improvements over conventional methods, as operations 806 and 808 may be decoupled in the sense that the two operations can be performed and completed in two different time periods. Additionally or alternatively, this allows testing on multiple pedestals, chambers, and/or sides to be conducted simultaneously while allowing each test to proceed independently, further improving the speed and efficiency of the processes and systems.

Regardless of the modeling tests selected, the modeling tests can utilize machine learning algorithms, such as substrate modeling algorithm 613b, or the like as discussed above to model how changes in temperature or power of one or more heater zones as well as chamber and process conditions effect various substrate regions. Namely, as previously noted, the present technology provides for the modeling of substrate regions disposed directly above (e.g. vertical control as discussed above) a specific heater or heating zone, as well as substrate regions disposed above, but laterally (e.g. x-y plane as illustrated in FIGS. 7A and 7B, horizontal effects and/or control as discussed above) adjacent (e.g., the substrate region overlies a boundary of the respective heater or heating zone), or even laterally spaced apart (e.g., a substrate region that does not overlie the heater or heating zone or a boundary of the heater or heating zone).

Thus, in embodiments, the one or more modeling tests may be utilized to generate an accurate vertical and horizontal representation of substrate behavior based on the chamber and pedestal conditions. Namely, unlike conventional processes that merely take into account the temperature of the pedestal, the modeling tests and substrate modeling algorithm 613b are able to take into account any chamber and pedestal conditions present, including material properties of the substrate, the desired processing recipe, and any other factors discussed above. The vertical effect, as explained earlier, provides information about the effect of a single or localized group of heating zones onto the substrate, whereas the horizontal effect describes the interaction among adjacent regions on the substrate surface. The use of a horizontal effect to model the substrate behavior on an x-y plane is a major shift with respect to conventional technologies, as the determination of any horizontal effect allows for significant test time reduction and major performance improvements during the substrate control operation 812. Moreover, unlike conventional processes and methods, the model generated with the method in the present technology is custom generated around the specific process recipe, chamber, and pedestal utilized. Hence, unlike conventional methods, the results obtained with the methods discussed herein are not susceptible to undesired and unexpected chamber-to-chamber, side-to-side, and pedestal-to-pedestal differences.

In embodiments, the substrate target profile 611 represents the desired processing outcome on the substrate surface at each discrete point or region. Thus, if the targeted substrate property is temperature, the substrate target profile represents the desired temperature of the substrate across the substrate surface. In embodiments, if the targeted substrate property is temperature, the substrate target profile can be selected to match the initial pedestal temperature or may be an optimum temperature profile decided prior to processing. Additionally or alternatively, the substrate target profile can represent the desired processing outcome on the substrate of one or more of the other substrate properties discussed above. In such an aspect, and unlike conventional methods, the closed-loop substrate control 612 can be utilized for any targeted substrate property, as the information about the behavior of the targeted substrate property is contained within the model generated by the substrate modeling algorithm 613b, regardless of the targeted substrate property. Nonetheless, regardless of the targeted substrate property, as noted above, the behavior of the targeted substrate property may be controlled by controlling heater power or heater temperature.

Regardless of the substrate target profile 611, as noted above, the present technology has found that consistent substrate temperature across the substrate provides improved substrate processing uniformity even if such substrate temperatures result in non-uniformity of pedestal heaters or heating zone temperatures. Namely, the processes and methods of the present technology utilize the discussed modeling and direct substrate feedback to overcome inconsistencies in the chamber, pedestal, side of the chamber, or the like, which can require inconsistent heater temperatures across various heaters and/or heater zones. For instance, data representing the initial substrate feedback and the substrate model generated by the one or more modeling tests of substrate modeling algorithm 613b are provided to a substrate control algorithm 613a contained in the substrate control architecture 600/612 at operation 810.

Based upon the initial substrate feedback and the substrate model, the substrate control algorithm 613a (also referred to as a processor running such an algorithm) changes the initial substrate processing recipe by correcting the heater power or targeted heater temperature at one or more of the pedestal heating zones at operation 812 and/or by correcting a targeted temperature 620 for the HX/chiller 606, providing an updated substrate processing recipe. As noted above, due to the substrate model provided after conducting one or more modeling tests, the correction may be applied at one or more heaters or heating zones directly below a targeted substrate region or regions (e.g. a substrate region containing a targeted substrate property), adjacent to a targeted substrate region or regions, or spaced apart from a targeted region or regions. Namely, due to the modeling test(s) conducted, the substrate control algorithm 613a may initially consider more than one option to regulate the substrate to the substrate target profile.

For instance, as an example only, a first option may be to increase or decrease a targeted temperature of a heater or heating zone directly below a targeted substrate region (e.g. vertical effect as discussed above). However, in an example, the heater or heating zone may already be at a maximum or minimum power, leaving the heater or heating zone incapable of satisfying the required targeted temperature change. Alternatively, in a further example, a first targeted substrate region may have a temperature above a targeted substrate profile for the respective region but a second targeted substrate region adjacent to the first targeted substrate region may have a temperature below a targeted substrate profile for the respective region. In such an example, correcting the heater or heating zone directly below the first targeted substrate region may negatively influence the second targeted substrate region. Thus, in one or both examples, a substrate control algorithm 613a may decline to conduct the first correction, and instead utilize a further option, such as correcting an adjacent heater or heating zone (such as a heater further from the second targeted substrate region in the second example), or correcting more than one heater or heating zone with less power or heat. Therefore, it should be clear that the substrate control algorithm 613a of the present technology provides marked improvements over conventional technology that requires manual adjustment on a zone-by-zone and/or pedestal-by-pedestal basis.

In embodiments, the number of targeted substrate regions may be at least about 1 region, such as greater than or about two regions, such as greater than or about three regions, such as greater than or about four regions, such as greater than or about five regions, such as greater than or about six regions, such as greater than or about seven regions, such as greater than or about eight regions, such as greater than or about nine regions, such as greater than or about ten regions, such as greater than or about 15 regions, such as greater than or about 20 regions, such as greater than or about 25 regions, such as greater than or about 30 regions, such as greater than or about 40 regions, such as greater than or about 50 regions, or any ranges or values therebetween. As noted above, in embodiments, targeted substrate regions may be any one or more discrete points across the substrate 602 or may be regions that generally mirror the shape of the underlying heater or heating zone of the pedestal 604.

However, additionally or alternatively, in embodiments, the number of targeted substrate regions may be based upon the number of regions that vary from the substrate target profile. Thus, in embodiments, the targeted substrate region(s) and number thereof may be all or a portion of the substrate regions that vary from the substrate target profile by greater than or about 1%, such as greater than or about 2%, such as greater than or about 3%, such as greater than or about 4%, such as greater than or about 5%, such as greater than or about 6%, such as greater than or about 7%, such as greater than or about 8%, such as greater than or about 9%, such as greater than or about 10%, such as greater than or about 11%, such as greater than or about 12%, such as greater than or about 13%, such as greater than or about 14%, such as greater than or about 15%, or any ranges or values therebetween.

Moreover, in embodiments, the number of corrected heaters or heating zones may be at least about 1 heater or heating zone, such as greater than or about two, such as greater than or about three, such as greater than or about four, such as greater than or about five, such as greater than or about six, such as greater than or about seven, such as greater than or about eight, such as greater than or about nine, such as greater than or about ten, such as greater than or about 15, such as greater than or about 20, such as greater than or about 25, such as greater than or about 30, such as greater than or about 40, such as greater than or about 50, such as greater than or about 75, such as greater than or about 100 heaters or heating zones, or any ranges or values therebetween.

However, in embodiments, it should be clear that more than one heating zone or heater may be corrected for each targeted substrate region, or that one heating zone or heater may be corrected for a number of targeted substrate regions. Thus, in embodiments, the number of heaters or heating zones to be corrected may be less than, equal to, or greater than the number of targeted substrate regions.

Nonetheless, to regulate the substrate, the substrate control algorithm 613a generates a correction or corrections to the targeted heater temperature 610. However, as noted above, it should be clear that targeted heater temperature 610 can also be generated as pedestal heater power, as the substrate control architecture 600 utilized herein contains values of pedestal heater power necessary to achieve specific heater temperatures. In any case, the targeted heater temperature 610 is provided to the heater temperature control 614, and output to the pedestal as a heater property control 616 (e.g. temperature or power) via heater electronics 618 to pedestal 604.

As illustrated, in FIG. 6, in embodiments, the heater temperature control 614 may be configured to regulate the temperature of each heater or heater zone to the corresponding targeted value contained within 610. In embodiments, the closed-loop heater temperature control 614 may receive heater temperature feedback 608 from pedestal 604. While the present technology has found that a uniform substrate target profile may require a non-uniform temperature across the surface of the pedestal 604, such a closed-loop heater temperature control 614 may serve as a valuable method of automatically confirming that the targeted heater temperatures 610 provided by the closed-loop substrate control 612 have been achieved. Thus, such a closed-loop heater temperature control may allow for a quick and efficient method for confirming process conditions and evaluating the pedestal 604 response to the heater property control 616.

In embodiments, the updated processing recipe may be sufficient to achieve the substrate target profile. For instance, in embodiments, a substrate 602, which may be the same substrate or a different substrate from operations 802 to 808 is processed according to the updated substrate processing recipe. After processing the substrate 602 according to the updated processing recipe, updated substrate feedback of the one or more targeted substrate properties can be collected. The updated substrate feedback is then compared to the substrate target profile 611. In embodiments, all, or substantially all of the targeted substrate regions may achieve the requirements set within the substrate target profile 611 based upon the updated substrate processing recipe.

However, in embodiments, one or more targeted substrate regions (which may be the same regions previously corrected for, or may be new regions) may vary from the substrate target profile in that region (or on average) by greater than or about 1%, such as greater than or about 2%, such as greater than or about 3%, such as greater than or about 4%, such as greater than or about 5%, such as greater than or about 6%, such as greater than or about 7%, such as greater than or about 8%, such as greater than or about 9%, such as greater than or about 10%, such as greater than or about 11%, such as greater than or about 12%, such as greater than or about 13%, such as greater than or about 14%, such as greater than or about 15%, or any ranges or values therebetween.

In such embodiments, operations 810 and 812 may be repeated with further updated substrate feedback and a further updated processing recipe until the desired level of substrate property regulation to the substrate target profile is achieved. For instance, if one or more targeted substrate regions is outside of the substrate target profile 611, further updated substrate feedback can be provided to the substrate control algorithm 613a. However, the present technology has surprisingly found that, in embodiments, no new modeling is necessary, as the interactions between the substrate 602 and the chamber remain unchanged from the modeling step. Thus, the substrate control algorithm 613a modifies the updated substrate processing recipe by correcting the heater power or targeted heater temperature at one or more of the heating zones at repeated operation 812, providing a second updated substrate processing recipe. In other embodiments, if the expected substrate variation, derived within the closed-loop substrate controller 612 based on the previous knowledge of the substrate model and the last corrections made to the targeted pedestal heater temperature, significantly differs from the actual updated substrate feedback, the substrate modeling algorithm 621 can be utilized to correct the substrate model. Such a correction is contained within operation 812. As would be clear to one having skill in the art, the correction and re-check/compare of the updated substrate feedback may therefore be considered to be an iterative process in embodiments, and may therefore proceed for a third, fourth, fifth, or greater iterations of substrate feedback, correction, and updated substrate processing recipe, if necessary to achieve the substrate target profile 611. However, in embodiments, the correct and re-check iterative process may be conducted for less than or about five iterations, such as less than or about four iterations, such as less than or about three iterations, such as less than or about two iterations, such about one iteration, or any values therebetween.

Regardless of the number of iterations, if any, after a "final" processing recipe has been achieved (e.g., where all or substantially all of the targeted substrate regions meet the requirements provided within the substrate target profile), the system is set for production. Thus, further substrates, such as greater than or about 5, such as greater than or about 10, such as greater than or about 50, such as greater than or about 100, or any number of substrates may be commercially processed utilizing the final substrate processing recipe.

For instance, in such a "final" processing recipe, the substrate, such as substrate 700 of FIG. 7B may have a first region 710 and a second region 712 spaced apart from the first region. The temperature may vary from the first region 710 to the second region by less than or about 10%, such as less than or about 9%, such as less than or about 8%, such as less than or about 7%, such as less than or about 6%, such as less than or about 5%, such as less than or about 4%, such as less than or about 3%, such as less than or about 2%, such as less than or about 1%, such as less than or about 0.5%, such as less than or about 0.25%, such as less than or about 0.1%, or any ranges or values therebetween.

Figure 9:
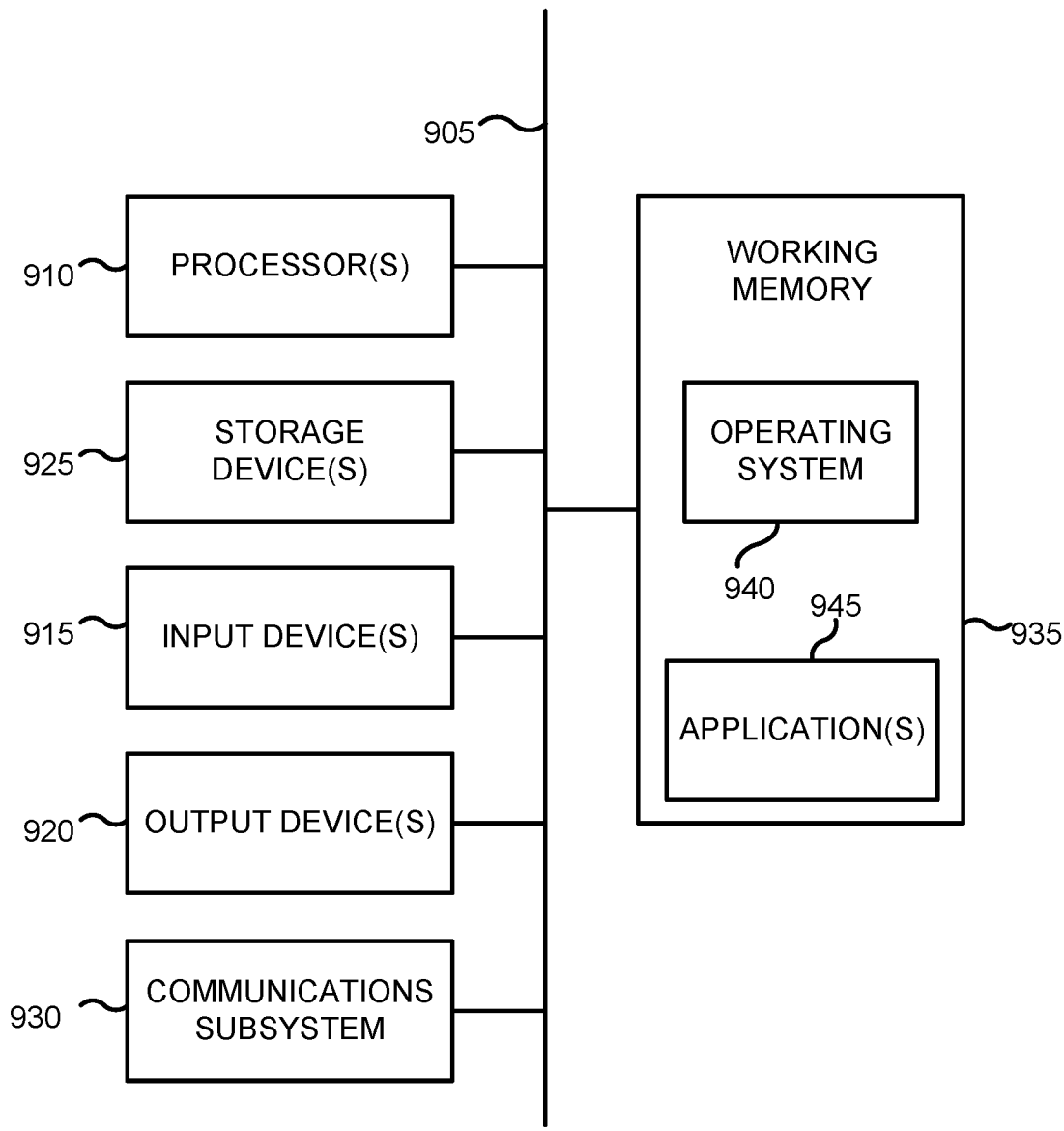
FIG. 9 illustrates a block diagram of a sample computer system that may operate embodiments of the present technology.
Figure 9:

Nonetheless, as illustrated in FIG. 9, in embodiments, the systems and methods may be executed fully or in part by a processor which may be incorporated as part of the previously described controller 148 and/or processor 536. For example, computer system 900 can represent some of the components of a controller or computer system described herein. FIG. 9 provides a schematic illustration of one embodiment of a computer system 900 that can perform the methods provided by various other embodiments, as described herein. FIG. 9 is meant only to provide a generalized illustration of various components, any or all of which may be utilized as appropriate. FIG. 9, therefore, broadly illustrates how individual system elements may be implemented in a relatively separated or relatively more integrated manner.

The computer system 900 is shown including hardware elements that can be electrically coupled via a bus 905 (or may otherwise be in communication, as appropriate), which may also be connected with controller 148. The hardware elements may include a processing unit 910, including without limitation one or more processors, such as one or more central processing units (CPUs), graphical processing units (GPUs), special-purpose processors (such as digital signal processing chips, graphics acceleration processors, and/or the like); one or more input devices 915, which can include without limitation a keyboard, a touchscreen, receiver, a motion sensor, a camera, a smartcard reader, a contactless media reader, and/or the like; and one or more output devices 920, which can include without limitation a display device, a speaker, a printer, a writing module, and/or the like.

The computer system 900 may further include (and/or be in communication with) one or more non-transitory storage devices 925, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The computer system 900 might also include a communication interface 930, which can include without limitation a modem, a network card (wireless or wired), an infrared communication device, a wireless communication device and/or chipset (such as a Bluetooth™ device, an 502.11 device, a Wi-Fi device, a WiMAX device, an NFC device, cellular communication facilities, etc.), and/or similar communication interfaces. The communication interface 930 may permit data to be exchanged with a network (such as the network described below, to name one example), other processors, and/or any other devices described herein. In many embodiments, the computer system 900 will further comprise a non-transitory working memory 935, which can include a RAM or ROM device, as described above.

The computer system 900 also can also include software elements, shown as being currently located within the working memory 935, including an operating system 940, device drivers, executable libraries, and/or other code, such as one or more application programs 945, which may include processor programs provided by various embodiments, and/or may be designed to implement methods, and/or configure systems, provided by other embodiments, as described herein. Merely by way of example, one or more procedures described with respect to the method(s) or systems discussed above might be implemented as code and/or instructions executable by a computer (and/or a processor within a computer); in an aspect, then, such special/specific purpose code and/or instructions can be used to configure and/or adapt a computing device to a special purpose computer that is configured to perform one or more operations in accordance with the described methods.

A set of these instructions and/or code might be stored on a computer-readable storage medium, such as the storage device(s) 925 described above. In some cases, the storage medium might be incorporated within a computer system, such as computer system 900. In other embodiments, the storage medium might be separate from a computer system (e.g., a removable medium, such as a compact disc), and/or provided in an installation package, such that the storage medium can be used to program, configure and/or adapt a special purpose computer with the instructions/code stored thereon. These instructions might take the form of executable code, which is executable by the computer system 900 and/or might take the form of source and/or installable code, which, upon compilation and/or installation on the computer system 900 (e.g., using any of a variety of available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Moreover, hardware and/or software components that provide certain functionality can comprise a dedicated system (having specialized components) or may be part of a more generic system. For example, a risk management engine configured to provide some or all of the features described herein relating to the risk profiling and/or distribution can comprise hardware and/or software that is specialized (e.g., an application-specific integrated circuit (ASIC), a software method, etc.) or generic (e.g., processing unit 910, applications 945, etc.) Further, connection to other computing devices such as network input/output devices may be employed.

Some embodiments may employ a computer system (such as the computer system 900) to perform methods in accordance with the disclosure. For example, some or all of the procedures of the described methods may be performed by the computer system 900 in response to processing unit 910 executing one or more sequences of one or more instructions (which might be incorporated into the operating system 940 and/or other code, such as an application program 945) contained in the working memory 935. Such instructions may be read into the working memory 935 from another computer-readable medium, such as one or more of the storage device(s) 925. Merely by way of example, execution of the sequences of instructions contained in the working memory 935 might cause the processing unit 910 to perform one or more procedures of the methods described herein.

The terms "machine-readable medium" and "computer-readable medium," as used herein, refer to any medium that participates in providing data that causes a machine to operate in a specific fashion. In an embodiment implemented using the computer system 900, various computer-readable media might be involved in providing instructions/code to processing unit 910 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 925. Volatile media include, without limitation, dynamic memory, such as the working memory 935. Transmission media include, without limitation, coaxial cables, copper wire, and fiber optics, including the wires that comprise the bus 905, as well as the various components of the communication interface 930 (and/or the media by which the communication interface 930 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a magnetic medium, optical medium, or any other physical medium with patterns of holes, a RAM, a PROM, EPROM, a FLASH-EPROM, any other memory chip or cartridge, a carrier wave as described hereinafter, or any other medium from which a computer can read instructions and/or code.

The communication interface 930 (and/or components thereof) generally will receive the signals, and the bus 905 then might carry the signals (and/or the data, instructions, etc. carried by the signals) to the working memory 935, from which the processor(s) 910 retrieves and executes the instructions. The instructions received by the working memory 935 may optionally be stored on a non-transitory storage device 925 either before or after execution by the processing unit 910 and controller 148.

In the embodiments described above, for the purposes of illustration, processes may have been described in a particular order. It should be appreciated that in alternate embodiments, the methods may be performed in a different order than that described. It should also be appreciated that the methods and/or system components described above may be performed by hardware and/or software components (including integrated circuits, processing units, and the like), or may be embodied in sequences of machine-readable, or computer-readable, instructions, which may be used to cause a machine, such as a general-purpose or special-purpose processor or logic circuits programmed with the instructions to perform the methods. These machine-readable instructions may be stored on one or more machine-readable mediums, such as CD-ROMs or other type of optical disks, floppy disks, ROMs, RAMs, EPROMS, EEPROMs, magnetic or optical cards, flash memory, or other types of machine-readable mediums suitable for storing electronic instructions. Alternatively, the methods may be performed by a combination of hardware and software.

The methods, systems, devices, graphs, and tables discussed herein are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims. Additionally, the techniques discussed herein may provide differing results with different types of context awareness classifiers.

While illustrative and presently preferred embodiments of the disclosed systems, methods, and machine-readable media have been described in detail herein, it is to be understood that the inventive concepts may be otherwise variously embodied and employed, and that the appended claims are intended to be construed to include such variations, except as limited by the prior art.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a model" includes a plurality of such models, and reference to "the targeted property" includes reference to one or more properties and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method for controlling substrate processing, comprising:
    disposing a substrate on a pedestal, wherein the pedestal comprises a plurality of heating zones, each heating zone having an independent heater;
    processing the substrate according to an initial substrate processing recipe, the initial substrate processing recipe comprising one or more substrate processing steps and an initial pedestal temperature;
    collecting initial substrate feedback of one or more substrate properties;
    providing data representing the initial substrate feedback as a first input to a substrate control algorithm;
    generating a substrate model based upon one or more modeling tests of the substrate;
    providing, as a second input to the substrate control algorithm, the generated substrate model;
    correcting a heater power or a heater temperature and/or a heat-exchanger/chiller temperature of one or more of the heating zones to control a targeted substrate property in one or more substrate regions, wherein the correction is calculated and performed, by a processor running the substrate control algorithm, based on the first input and the second input; and
    updating the initial substrate processing recipe based upon the correction, forming an updated processing recipe.

2. The method of claim 1, wherein the one or more substrate properties comprises substrate temperature, thickness of one or more layers across a substrate, substrate etch depth, or a combination thereof measured at two or more spaced apart regions on the substrate.

3. The method of claim 2, wherein the one or more substrate properties is substrate temperature, and wherein the substrate comprises a plurality of temperature sensors, and wherein the substrate temperature is provided at each temperature sensor.

4. The method of claim 3, wherein the heater power or heater temperature and/or heat-exchanger/chiller temperature is corrected to control the targeted substrate property in one or more of the substrate regions corresponding to a portion of, or each of, the plurality of temperature sensors.

5. The method of claim 2, wherein the one or more substrate properties is thickness of one or more layers across a substrate, substrate etch depth, or combination thereof and wherein the heater power or heater temperature and/or heat-exchanger/chiller temperature is corrected to control the targeted substrate property at a portion of, or at each of, the two or more spaced apart regions.

6. The method of claim 1, wherein the one or more modeling tests comprise correcting the heater power or heater temperature of one or more heating zones and/or the heat-exchanger/chiller temperature.

7. The method of claim 1, wherein plurality of heating zones comprises greater than or about 5 heating zones.

8. The method of claim 6, wherein the one or more modeling tests are automatically selected based upon the initial substrate feedback or wherein the one or more modeling tests are generated by a substrate modeling algorithm, and wherein the correction is calculated and performed, by a processor running the substrate modeling algorithm.

9. The method of claim 1, further comprising processing the substrate according to the updated processing recipe and collecting updated substrate feedback of the one or more substrate properties.

10. The method of claim 1, wherein the substrate comprises two or more regions, wherein at least one of the two or more regions comprises the targeted substrate property, wherein the corrected heater power or heater temperature and/or heat-exchanger/chiller temperature is in one or more heating zones disposed horizontally adjacent to the region comprising the targeted substrate property.

11. The method of claim 9, further comprising comparing the updated substrate feedback to a substrate target profile, and, if a difference between the updated substrate feedback and the substrate target profile is greater than a predetermined level;
    further correcting the heater power or heater temperature and/or the heat-exchanger/chiller temperature of one or more of the heating zones to control the targeted substrate property in one or more of the substrate regions, wherein the further correction is calculated and performed, by the processor running the substrate control algorithm, based on data representing the updated substrate feedback and the second input; and
    updating the updated processing recipe based upon the further correction, forming a second updated processing recipe.

12. The method of claim 11, wherein the predetermined level is calculated from one or more modeling tests selected to estimate a noise value, wherein the predetermined level is greater than or about a level corresponding to the noise value.

13. The method of claim 11, further comprising updating the substrate model based upon the correction.

14. The method of claim 11, further comprising processing the substrate according to the second updated processing recipe and collecting second updated substrate feedback of the one or more substrate properties
comparing the second updated substrate feedback to the substrate target profile, and, if a difference between the second updated substrate feedback and the substrate target profile is greater than or about 5%,
conduction a third correction of the heater power or heater temperature and/or heat-exchanger/chiller temperature of the one or more of the heating zones to control the targeted substrate property in one or more of the substrate regions, wherein the third correction is calculated and performed, by the processor running the substrate control algorithm, based on data representing the second updated substrate feedback and the second input; and
updating the second updated processing recipe based upon the third correction, forming a third updated processing recipe.

15. A semiconductor processing system comprising:
a pedestal comprising a plurality of heating zones configured to support a substrate;
a controller configured to execute a substrate control algorithm that is part of a substrate control architecture and to:
process the substrate according to an initial substrate processing recipe, the initial substrate processing recipe comprising one or more substrate processing steps and an initial pedestal temperature;
collect initial substrate feedback of one or more substrate properties;
provide data representing the initial substrate feedback as a first input to the substrate control algorithm;
generate a substrate model based upon one or more modeling tests of the substrate;
provide, as a second input to the substrate control algorithm, the generated substrate model;
correct a heater power or a heater temperature and/or a heat-exchange/chiller temperature of one or more of the heating zones to control a targeted substrate property in one or more substrate regions, based on the first input and the second input; and
update the initial substrate processing recipe based upon the correction, forming an updated processing recipe.

16. The semiconductor processing system of claim 15, wherein each heating zone comprises a temperature sensor.

17. The semiconductor processing system of claim 15, wherein the substrate control algorithm is a closed-loop algorithm.

18. The semiconductor processing system of claim 15, wherein the one or more modeling tests are selected from a plurality of modeling tests generated by a substrate modeling algorithm.

19. A semiconductor processing system comprising:
a chamber body;
a first pedestal configured to support a first substrate, the first pedestal comprising a first plurality of heating zones, disposed in the chamber body;
a second pedestal configured to support a second substrate, the second pedestal comprising a second plurality of heating zones, disposed in the chamber body;
a controller configured to execute a substrate control algorithm that is part of a closed-loop substrate control, and to:
process the first substrate and the second substrate according to an initial substrate processing recipe, the initial substrate processing recipe comprising one or more substrate processing steps and an initial pedestal temperature;
collect initial substrate feedback of one or more substrate properties for the first substrate and the second substrate;
provide data representing the initial substrate feedback of the first substrate and the second substrate to the substrate control algorithm;
generate a first substrate model and a second substrate model based upon one or more modeling tests of the first substrate and the second substrate;
provide the first substrate model and the second substrate model to the substrate control algorithm;
correct a heater power or a heater temperature and/or a heat-exchanger/chiller temperature of one or more of the heating zones of the first plurality of heating zones and second plurality of heating zones to control a targeted substrate property in one or more substrate regions of the first substrate and the second substrate, wherein the correction is calculated and performed, by a processor running the substrate control algorithm, based on the initial substrate feedback of the first substrate and the first substrate model for the first substrate and the initial substrate feedback of the second substrate and the second substrate model for the second substrate.

20. The semiconductor processing system of claim 19, wherein the heater power or heater temperature and/or heat-exchanger/chiller temperature correction for the first plurality of heating zones is different than the correction for the second plurality of heating zones.

* * * * *